US012565416B2

(12) United States Patent
Langa et al.

(10) Patent No.: US 12,565,416 B2
(45) Date of Patent: Mar. 3, 2026

(54) MEMS HAVING A LARGE FLUIDICALLY EFFECTIVE SURFACE

(71) Applicant: Fraunhofer-Gesellschaft zur Förderung der angewandten Forschung e.V., Munich (DE)

(72) Inventors: Sergiu Langa, Dresden (DE); Holger Conrad, Dresden (DE); Bert Kaiser, Dresden (DE)

(73) Assignee: Fraunhofer-Gesellschaft zur Förderung der angewandten Forschung e. V., Munich (DE)

( * ) Notice: Subject to any disclaimer, the term of this patent is extended or adjusted under 35 U.S.C. 154(b) by 1205 days.

(21) Appl. No.: 17/476,348

(22) Filed: Sep. 15, 2021

(65) Prior Publication Data

US 2022/0002143 A1      Jan. 6, 2022

Related U.S. Application Data

(63) Continuation of application No. PCT/EP2020/057298, filed on Mar. 17, 2020.

(30) Foreign Application Priority Data

Mar. 21, 2019    (DE) .......................... 102019203914.6

(51) Int. Cl.
B81B 3/00 (2006.01)
H04R 19/00 (2006.01)

(52) U.S. Cl.
CPC ......... B81B 3/0021 (2013.01); H04R 19/005 (2013.01); B81B 2201/0257 (2013.01);
(Continued)

(58) Field of Classification Search
CPC ............ B81B 3/0021; B81B 2201/032; B81B 2201/033; B81B 2201/036; B81B 2201/0257; B81B 2203/051; H04R 19/005
(Continued)

(56) References Cited

U.S. PATENT DOCUMENTS

2012/0017693 A1    1/2012  Robert et al.
2013/0147313 A1    6/2013  Sachse
(Continued)

FOREIGN PATENT DOCUMENTS

AT            11920 U2      7/2011
DE     102010029936 A     12/2011
(Continued)

*Primary Examiner* — Emily P Pham
*Assistant Examiner* — Monica Mata
(74) *Attorney, Agent, or Firm* — Perkins Coie LLP; Michael A. Glenn

(57) ABSTRACT

An MEMS comprising a substrate having a cavity includes a movable layer arrangement arranged in the cavity including a first beam, a second beam and a third beam that is arranged between the first beam and the second beam and that is fixed at discrete areas electrically insulated from the same. The movable layer arrangement is configured to perform a movement along a direction of movement in a substrate plane in response to an electrical potential between a first beam and a third beam or in response to an electrical potential between the second beam and the third beam. The first, second, and third beams are part of a first layer of the movable layer arrangement. The movable layer arrangement includes a second layer arranged adjacent to the first layer along a direction perpendicular to the substrate plane. The second layer is arranged movably along the direction of movement.

8 Claims, 15 Drawing Sheets

(52) U.S. Cl.
CPC ... *B81B 2201/032* (2013.01); *B81B 2201/033* (2013.01); *B81B 2201/036* (2013.01); *B81B 2203/051* (2013.01); *H04R 2201/003* (2013.01)

(58) Field of Classification Search
USPC .......................................................... 310/311
See application file for complete search history.

(56) References Cited

U.S. PATENT DOCUMENTS

| | | | | |
|---|---|---|---|---|
| 2013/0301101 A1* | 11/2013 | Conrad | .................. | H02N 1/006 |
| | | | | 359/291 |
| 2014/0169594 A1 | 6/2014 | Zoellin et al. | | |
| 2015/0014796 A1 | 1/2015 | Dehe | | |
| 2015/0251899 A1 | 9/2015 | Dehe et al. | | |
| 2018/0179048 A1 | 6/2018 | Schenk et al. | | |
| 2019/0104616 A1* | 4/2019 | Marsh | .................. | B81C 1/0015 |

| | | | |
|---|---|---|---|
| 2019/0382257 A1 | 12/2019 | Langa et al. | |
| 2020/0087138 A1 | 3/2020 | Schenk et al. | |
| 2021/0370053 A1* | 12/2021 | Jin ...................... | A61N 1/0556 |

FOREIGN PATENT DOCUMENTS

| | | |
|---|---|---|
| DE | 102012223605 A1 | 6/2014 |
| DE | 102015210919 A1 | 12/2016 |
| DE | 102017203722 A1 | 9/2018 |
| DE | 102017206766 A1 | 10/2018 |
| JP | 2010173327 A | 8/2010 |
| JP | 2011087460 A | 4/2011 |
| JP | 2012027026 A | 2/2012 |
| JP | 2018521576 A | 8/2018 |
| TW | 201902812 A | 1/2019 |
| WO | 0048938 A1 | 8/2000 |
| WO | 03081762 A1 | 10/2003 |
| WO | 2008014305 A2 | 1/2008 |
| WO | 2012095185 A1 | 7/2012 |
| WO | 2016202790 A2 | 12/2016 |

* cited by examiner

MEMS HAVING A LARGE FLUIDICALLY EFFECTIVE SURFACE

CROSS-REFERENCE TO RELATED APPLICATIONS

This application is a continuation of copending International Application No. PCT/EP2020/057298, filed Mar. 17, 2020, which is incorporated herein by reference in its entirety, and additionally claims priority from German Application No. 102019203914.6, filed Mar. 21, 2019, which is also incorporated herein by reference in its entirety.

The present invention relates to a micromechanical system (MEMS) configured to comprise a large effective area for interaction with a fluid. The present invention relates in particular to NED (nanoscopic electrostatic drive) having an enlarged transversal surface due to stacking and/or arranging a rear structure or resistor structure.

BACKGROUND OF THE INVENTION

The principle of NED (nanoscopic electrostatic drive) is described in WO2012/095185 A1. NED is a novel MEMS (micro-electromechanical system) actuator principle. From a technological point of view, there are basically two types of NED actuators. Vertical NED (V-NED) and lateral NED (L-NED). In V-NED, the object, e.g. a silicon (Si beam) moves vertically, i.e. out of the substrate plane, for example defined by an Si disc or wafer. In L-NED, the object, such as an Si beam, moves laterally, i.e. within the plane, for example an Si disc.

In the NED gap, the situation can be described such that the smaller the electrode gap, the greater the electrical forces that act and accordingly larger is the desired deflection of the beam. This means that very small gap distances (e.g. in the nanometer range) are desirable.

Technologically, such small distances between the electrodes are not easy to produce. Usually, when producing the gap in silicon, methods for deep silicon etching (DSi) are used. A widely used method for DSi is the so-called Bosch method. With the Bosch method, very small gap distances can be etched, but only when the aspect ratio, i.e. the quotient between depth and width of a trench is not much more than 30.

This means when a gap distance of 300 nm is needed, the Bosch method can only etch up to a depth of 10 μm with reasonable quality. For many L-NED applications, the depth of only 10 μm is not sufficient. When depths of, for example 100 μm are needed, this can have the consequence that the width of the trench also has to be made ten times greater, i.e. approximately 3 μm wide.

FIG. 11a shows a schematic cross-sectional view or a cross section of a known MEMS 1000 configured as L-NED. The MEMS 1000 can comprise a substrate layer 1002, such as a handle wafer of a BSOI (bonded silicon on insulator) wafer. A device layer of the BSOI wafer is stacked thereon, wherein the layers 1002 and 1004 are connected via an oxide layer, a buried oxide (BOX) of the BSIO wafer. External electrodes 1008a and 1008b formed of the layer 1004 are arranged such that an internal electrode 1008c of the layer 1004 is arranged between the external electrodes 1008a and 1008b, wherein NED gaps 1012 1 and 1012 2 are arranged between the electrodes that can be obtained, for example, by means of the mentioned DSi method. External trenches 1014, and 10142 between the external electrodes 1008a and 10008b, respectively, and the material of the layer 1004 remaining as external substrate can define the movable beam formed by the electrodes and can, for example, also be formed by DSi. A height 1016 of the L-NED actuator can relate, for example, to an extension of the movable element, possibly by adding a gap, between the electrodes 1008a, 1008b and/or 1008c and the layer 1002, and perpendicular to a substrate plane, for example, defined by a main extension direction of the layer 1002.

FIG. 11b shows a schematic top view of the M EMS 1000. The electrodes 1008a and 1008c as well as 1008b and 1008c can each be mechanically firmly connected to one another via an insulation layer 1022 arranged on discrete areas. The movable element formed by the movable electrodes 1008a, 1008b and 1008c can be movable along the lateral direction of movement 1024 arranged in-plane.

The lateral movement of the L-NED actuator can result in a movement of the medium (e.g. air or liquid) in which the actuator moves. This movement of the medium can be used to produce (micro) loudspeakers or (micro) pumps based on L-NED actuators. The volume of a loudspeaker or the power of a pump depends on the size of the moved volume (air or liquid). In the case of an L-NED actuator, the moved volume is determined by the amount of the deflection, i.e. the amplitude along the direction of movement 1024 and the height 1016 of the L-NED actuator. Therefore, it is desirable to produce MEMS loudspeakers and/or MEMS pumps where the L-NED actuator is high and has a large deflection.

As discussed above, the following general statements apply for L-NED actuators:

the smaller the gap of the L-NED actuator, the greater the deflection;

the smaller the gap of the L-NED actuator, the smaller the height of the actuator based on the limited aspect ratio during production (Bosch method).

This means that the production process makes it very difficult to obtain both a small gap (large deflection) and a large height of the beam.

The principle of micro loudspeaker or micro pump based on L-NED is described in DE10 2015 210 919 A1.

FIG. 12 shows a schematic cross-sectional view of an MEMS 2000 known therefrom, which largely corresponds to the side sectional view of the MEMS 1000, wherein the layer 1002 can additionally comprise an opening 1026 to allow a volume flow between a cavity 1028 in which the electrodes 1008a, 1008b and 1008c move and an external environment of the MEMS 2000. Above that, by means of a further insulating layer 10062, a further substrate layer 1032 is arranged that can form, for example, a lid of the MEMS 2000 and also comprises an opening 1034 that can serve, for example, as inlet opening for the cavity 1028 when the opening 1026 serves as acoustic or fluidic outlet. Distances 10361 between the layer 1002 and the electrodes 1008a, 1008b and/or 1008c and/or a distance 10362 between the electrodes and the lid wafer 1032 can usually have values of approximately 1 μm (determined by the thermal oxidation of Si: 10 nm-10 μm).

The main principle according to FIG. 12 is to provide an L-NED actuator, produced on a BSOI wafer, also called device wafer as described in the context of FIG. 11a and FIG. 11b, with a lid wafer 1032. Device wafer and lid wafer can be bonded by means of a bonding method. Inlets and outlets 1026 and 1034 are provided for the acoustic signals or fluidics.

The L-NED beam can move laterally and in that way the same can generate an acoustic effect or pump effect. The acoustic effect and the pump effect become more effective when the ratio between L-NED height and L-NED gap is large, the greater the better. The ratio between L-NED height

1016 and L-NED gap 1012 is approximately 30. This limitation results from the production process in Si technology.

Above that, the L-NED beam according to FIG. 12 is limited by the vertical pull-in effect (pull-in =mechanical and/or electrical contact between L-NED beam and lid wafer or handle wafer, such as by electrostatic forces). This means when voltage is applied to one of the L-NED electrodes 1008*a*, 1008*b* or 1008*c* and the layer 1002 and/or 1032 are connected to ground, an electrical vertical force results, which pulls the L-NED beam towards the bottom or towards the top. Since the distances 10361 and 10362 between L-NED beam and lid wafer 1032 or handle wafer 1002 are relatively small (in a range of 1 bis 2 μm), the movement of the L-NED beam towards the bottom (vertical, z direction) can result in a pull-in effect. For two reasons, the vertical pull-in is not desirable:

mechanical: mechanical contact between L-NED beam and lid wafer or handle wafer during operation can result in mechanical destruction of the device. Above that, the fidelity of movement which is intended to be very high (expected systematic connection between input and output signal) can be limited, so that distortions, friction losses and non-linearities result;

electrical: electrical contact between L-NED beam and lid wafer or handle wafer during operation can result in electrical destruction of the device (short-circuit).

DE 10 2017 203 722 A1 describes that large aspect ratios can be obtained by subsequent shifting of the electrodes with respect to one another. Subsequent shifting of the electrodes is a further process that is difficult to control and hence prone to errors.

Therefore, MEMS with in-plane movable elements that have a large aspect ratio and are easy to produce would be desirable.

SUMMARY

According to an embodiment, an MEMS may have: a substrate including a cavity; a movable layer arrangement arranged in the cavity including a first beam, a second beam and a third beam that is arranged between the first beam and the second beam and that is fixed at discrete areas electrically insulated from the same; wherein the movable layer arrangement is configured to perform a movement along a direction of movement in a substrate plane in response to an electrical potential between the first beam and the third beam or in response to an electrical potential between the second beam and the third beam; wherein the first, second and third beam are part of a first layer of the movable layer arrangement and the movable layer arrangement includes a second layer that is arranged adjacent to the first layer along a direction perpendicular to the substrate plane, wherein the second layer is arranged movably along the direction of movement; wherein, in relation to the first layer, the second layer provides additional area for interaction with the fluid.

A core idea of the present invention is the finding that the electrode layer of the L-NED devices can be supplemented by a further second layer providing additional area for interaction with the fluid. This second layer can be produced with already existing and controllable processes and can therefore enable simple production and at the same time increase the effective aspect ratio.

According to an embodiment, an MEMS includes a substrate comprising a cavity. The MEMS includes a movable layer arrangement arranged in the cavity including a first beam, a second beam and a third beam that is arranged between the first beam and the second beam and that is fixed at discrete areas electrically insulated from the same, wherein the movable layer arrangement is configured to perform a movement along a direction of movement in a substrate plane according to an electrical potential between the first beam and the third beam or in response to an electrical potential between the second beam and the third beam. The first, second and third beam are part of a first layer of the movable layer arrangement. The movable layer arrangement includes a second layer that is arranged adjacent to the first layer along a direction perpendicular to the substrate plane and arranged movably along the direction of movement. Compared to the beam arrangement, the second layer enables additional effective area for interaction with a fluid, i.e. a gas and/or a liquid.

According to an embodiment, the second layer is structured into a fourth, fifth and sixth beam. Along the direction perpendicular to the substrate plane, such as z, the fourth beam is arranged adjacent to the first beam, the fifth beam is arranged adjacent to the second beam and the sixth beam is arranged adjacent to the third beam, at least in a resting state of the MEMS. This enables additional actively controllable area.

According to an embodiment, the first beam is mechanically connected to the fourth beam and/or the second beam to the fifth beam and/or the third beam to the sixth beam via an intermediate layer arranged between the first layer and the second layer. This enables small fluidic losses between the beams and the mechanical coupling of the movement of the individual beams.

According to an embodiment, the third beam and the sixth beam are mechanically connected to one another via an intermediate layer arranged between the first layer and the second layer. The intermediate layer is removed between the first beam and the fourth beam on the one hand and between the second beam and the fifth beam on the other hand in order to distance the first beam from the fourth beam and to distance the second beam from the fifth beam. This enables low mass to be moved, since movement coupling can still be obtained via mechanical fixings between the fourth, fifth and sixth beam.

According to an embodiment, the first beam and the fourth beam on the one hand, and the second beam and the fifth beam on the other hand are mechanically connected to one another via an intermediate layer arranged between the first layer and the second layer. The intermediate layer is removed between the third beam and the sixth beam to provide a gap between the third beam and the sixth beam. This also enables a low mass.

According to an embodiment, the first layer and the second layer are connected to one another in an area of the substrate via an intermediate layer, such as an insulation layer, such as silicon oxide, silicon nitride or polymer. The intermediate layer is removed in an area of the cavity between the first beam and the fourth beam, between the second beam and the fifth beam and between the third beam and the sixth beam. This enables the independent movement of the first, second and third beam with respect to the fourth, fifth and sixth beam.

According to an embodiment, the first, second and third beam form a first movable element of the movable layer structure. The fourth, fifth and sixth beam form a second movable element of the movable layer structure. The first movable element is arranged movably with respect to the second movable element along the direction of movement. This enables individual deflection of the movable element which offers high degrees of freedom, both sensorially as well as actuatorically.

According to one embodiment, different electrical potentials can be applied between the first beam and the third beam on the one hand, and between the fourth beam and the sixth beam on the other hand. Alternatively or additionally, different electrical potentials can be applied between the second beam and the third beam on the one hand, and between the fifth beam and the sixth beam on the other hand. This enables independent evaluation and/or control of the movable element, for example out of phase or phase-offset.

Some of the above described embodiments are described such that the second layer is structured into beams and an enlargement of the effective area is obtained by means of additional beam area compared to the first layer. Further embodiments whose features can alternatively or additionally be combined with an inventive apparatus relate to the fact that the second layer provides a resistor structure for interaction with a fluid in the cavity. For this, it can be sufficient to configure the resistor structure in an electrically passive manner, which enables simple implementation. At the same time, pull-in effects between the resistor structure and external areas can be reduced or prevented.

According to an embodiment, the first beam, the second beam and the third beam form a movable element. The second layer forms a resistor structure for interaction with a fluid in the cavity. The resistor structure is mechanically connected to the movable element and co-moved by the movable element. This enables the enlargement of the actually effective aspect ratio by the additional arrangement of the resistor structure, wherein this can be implemented with simple and precise processes.

According to an embodiment, the resistor structure is connected to the first layer by means of an intermediate layer. This enables a simple configuration by forming the MEMS from a stack structure.

According to an embodiment, the first layer includes, in addition to the first, second and third beam, a piggyback element which is mechanically fixed to the first or second beam on a side facing away from the third beam, i.e. in-plane on the outside of the beam arrangement. The resistor structure is at least partly arranged on the piggyback element. This enables the arrangement of the resistor structure on an element that is not necessarily actively deformed electrically, such that a low degree of deformation energy is needed for deforming the resistor structure.

According to an embodiment, the piggyback element is mechanically fixed to the first, second or third beam. The resistor structure is at least partly arranged on the piggyback element. This enables a simple production.

According to an embodiment, the piggyback element is mechanically connected to the first or second beam via a coupling element, wherein the coupling element is arranged in an area that is at most slightly deformed during deformation of the active element in an area of maximum deflection of the movable element, and the movable element is not arranged where a high degree of material strain takes place. This enables prevention of unnecessary high mechanical energies for the deformation of the coupling element and/or the resistor structure.

According to an embodiment, the resistor structure comprises several partial elements arranged perpendicular to the direction of movement and parallel to the substrate plane along an axial extension direction of the movable layer arrangement. This enables reduction of the effective stiffness of the resistor structure such that low forces are sufficient to effect the deformation of the resistor structure. This enables, alternatively or additionally, reduction or prevention of mechanical interactions between the individual partial elements.

According to an embodiment, the partial elements have a distance to one another in a projection into a plane perpendicular to the substrate plane and perpendicular to the direction of movement. This enables freedom of contact during deformation and/or a low mass of the resistor structure.

According to an embodiment, the distance is at most 100 μm, advantageously at most 10 μm and most advantageously at most 2 μm. This enables low fluidic losses or the fluidic effect of the resistor structure as wall-like structure.

According to an embodiment, the partial elements are mechanically firmly connected, either to the first beam or to the second beam or to the third beam. This enables low fluidic losses by reducing or preventing a diagonally moved fluid point.

According to an alternative embodiment, the partial elements are arranged on at least two out of the first beam, the second beam and the third beam. While the wall effective along the direction of movement could be attenuated by the partial elements arranged in this regard offset along the depth direction, the resistor structure enables a fully or partially symmetrical mass distribution at the beams. Possibly adverse effects can be compensated by an overlap of the partial areas in a projection into the above-mentioned plane perpendicular to the substrate plane.

According to an embodiment, a first distance between the resistor structure and the substrate is greater than a second distance between the first beam and the third beam along or opposite to the direction of movement. Since the resistor structure can be configured in a passive manner and is implemented for fluidic interaction, the arrangement of gap structures subject to the limitations of the aspect ratios can be omitted. Thereby, all in all, greater gaps are possible, such that large effective dimensions can be obtained along the z direction without needing complicated processes, which is advantageous.

According to an embodiment, the first distance is greater than the second distance by at least the factor range 1 to 20, advantageously 3 to 10, most advantageously 5 to 7.

According to an embodiment, the second layer comprises a layer lid perpendicular to the substrate plane, such as along z, which is greater than the first layer by at least a factor range 1 to 20, advantageously 3 to 10, most advantageously 5 to 7. This enables particularly effective MEMS.

According to an embodiment, an aspect ratio of the first layer with respect to layer thickness of the first layer and a distance between the first beam and the third beam or the second beam and the third beam is less than 40, which enables simple process control.

According to an embodiment, the resistor structure is a first resistor structure arranged on a first side of the first layer. Further, the MEMS comprises a second resistor structure arranged on a second side of the first layer arranged opposite to the first side. This enables particularly high effectivity of the MEMS by enlargement of the fluidically effective area on both sides.

According to an embodiment, the resistor structure provides a fluidic resistor for a fluid arranged in the cavity, which is particularly advantageous for actuator-implementation as loudspeaker or pump, but also for sensory implementation such as microphone or other implementations such as MEMS THz waveguide.

According to an embodiment, the advantages of the resistor structure and the additional beam layer can be combined. For this, the movable layer arrangement comprises a third layer structured into fourth, fifth and sixth beams, such that both two beam layers as well as at least one resistor structure are implemented, which enables a further increase in efficiency.

Here, the first, second and third beam can be mechanically connected to form a first movable element while the fourth, fifth and sixth beam are mechanically connected to form a second movable element.

According to an embodiment, the first movable element is mechanically connected to the second movable element which enables higher aspect ratios when considering the technological limits of aspect ratios and enables lower operating voltages since high forces can already be generated by low voltages.

According to an embodiment, the resistor structure is a first resistor structure, wherein the MEMS comprises a second resistor structure connected to the second movable element. This enables, on the one hand, high flexibility by individual control and/or sensing or a detection with the different movable elements whose effective area is enlarged on both sides, as well as simple production.

According to an embodiment, the first movable element and the second movable element are arranged adjacent to one another and between the first resistor structure and the second resistor structure along a direction perpendicular to the substrate plane. This enables the arrangement of possibly passive resistor structures to the outside to structures that are possibly connected to ground such that low forces of attraction act and pull-in effects can be prevented.

According to an alternative embodiment, the first resistor structure and the second resistor structure are arranged adjacent to one another and along a direction perpendicular to the substrate plane between the first movable element and the second movable element. This enables a large distance between the movable elements and hence low electrical cross-influences.

According to an embodiment, the first resistor structure and the second resistor structure are movable with respect to one another, which has the advantage, in particular in actuator implementations, that the movable elements can be controlled independent of one another.

According to an embodiment, the movable layer structure includes a bending beam structure clamped on one side of the substrate. A bending beam structure clamped on one side enables large deflections at the free end, which is particularly advantageous since, according to the above embodiments, pull-in effects are reduced or prevented, for the prevention of which clamping on two sides can be provided, the amplitude reduction of which can be prevented here.

According to an embodiment, a layer thickness of the first layer and the second layer perpendicular to the substrate plane is at least 50 µm. This enables particularly large MEMS.

According to an embodiment, an axial extension direction of the movable layer arrangement parallel to the substrate plane and perpendicular to the direction of movement is configured such that a dimension of at least factor 0.5 to the height of the movement structure is obtained, which is particularly advantageous, since the dimension or length influence the efficiency in the same way as the height or thickness.

According to an embodiment, the cavity is fluidically connected to the external environment of the substrate by at least one opening, wherein the at least one opening is arranged in a plane of the movable layer arrangement. This enables the bottom layer and/or lid layer to be used for other purposes since chip area can be used for other purposes than for an opening.

According to an embodiment, the MEMS is configured as MEMS pump, as MEMS loudspeaker, as MEMS microphone or as MEMS THz waveguide.

According to an embodiment, the MEMS includes control means configured to control the movable layer structure.

According to an embodiment, the first, second and third beam form a first movable element, wherein the MEMS comprises a plurality, i.e. at least two movable elements. The control means is configured to individually control the plurality of movable elements, which enables high degrees of freedom when implementing the MEMS.

BRIEF DESCRIPTION OF THE DRAWINGS

Embodiments of the present invention will be detailed subsequently referring to the appended drawings, in which:

FIG. 11b is a schematic top view of the MEMS of FIG. 11a; and

DETAILED DESCRIPTION OF THE INVENTION

Before embodiments of the present invention will be discussed below in more detail based on the drawings, it should be noted that identical, functionally equal or equal elements, objects and/or structures in the different figures are provided with the same reference numbers such that the description of these elements illustrated in different embodiments is inter-exchangeable or inter-applicable.

In the following, reference is made to MEMS converters (MEMS=micro-electromechanical system). An MEMS converter can comprise one or several electroactive components that effect a change in a mechanical component, i.e. a conversion, based on an applied electrical quantity (current, voltage, charge or the same). This change can relate, for example, to a deformation, heating or tension of the mechanical component. Alternatively or additionally, a mechanical impact on the component, such as deformation, heating or tension can result in an electrical signal or electrical information (voltage, current, charge or the same) that can be detected at electrical terminals of the component. Some materials or components have a reciprocity, this means the effects are inter-exchangeable. For example, piezo materials can comprise the inverse piezoelectric effect (deformation based on an applied electrical signal) and the piezoelectric effect (providing an electrical charge based on a deformation).

Some of the embodiments described below relate to the fact that an electrode arrangement forms a movable element. Here, the movement of the movable element can be obtained from a deformation of the electrode arrangement. With reference to the sensory functionality by a possible reciprocity, an actuator configuration can be configured such that the electrode arrangement deforms macroscopically along a lateral direction of movement, i.e. an element or area can be movable along the lateral direction of movement. The element or area can, for example be a beam end or a center area of a beam structure. Viewed microscopically, when deforming the deformable element along the lateral direction of movement, a deformation of the deformable element can occur perpendicular to the lateral direction of movement. Subsequently described embodiments relate to the macroscopic approach.

Some of the embodiments described below relate to electrodes that are connected to one another via mechanical fixings and are configured to perform a movement based on an electrical potential. However, embodiments are not limited to that, but can comprise any type of beam structures, i.e. beams that are configure to provide, in response to an actuation, a force converted into movement via a mechanical fixing (actuator) and/or to detect a deformation (sensor) such as by using piezoelectric materials or other actuated materials. The beams can, for example, be electrostatic, piezoelectric and/or thermomechanical electrodes that provide deformation based on an applied potential.

Figure 1:
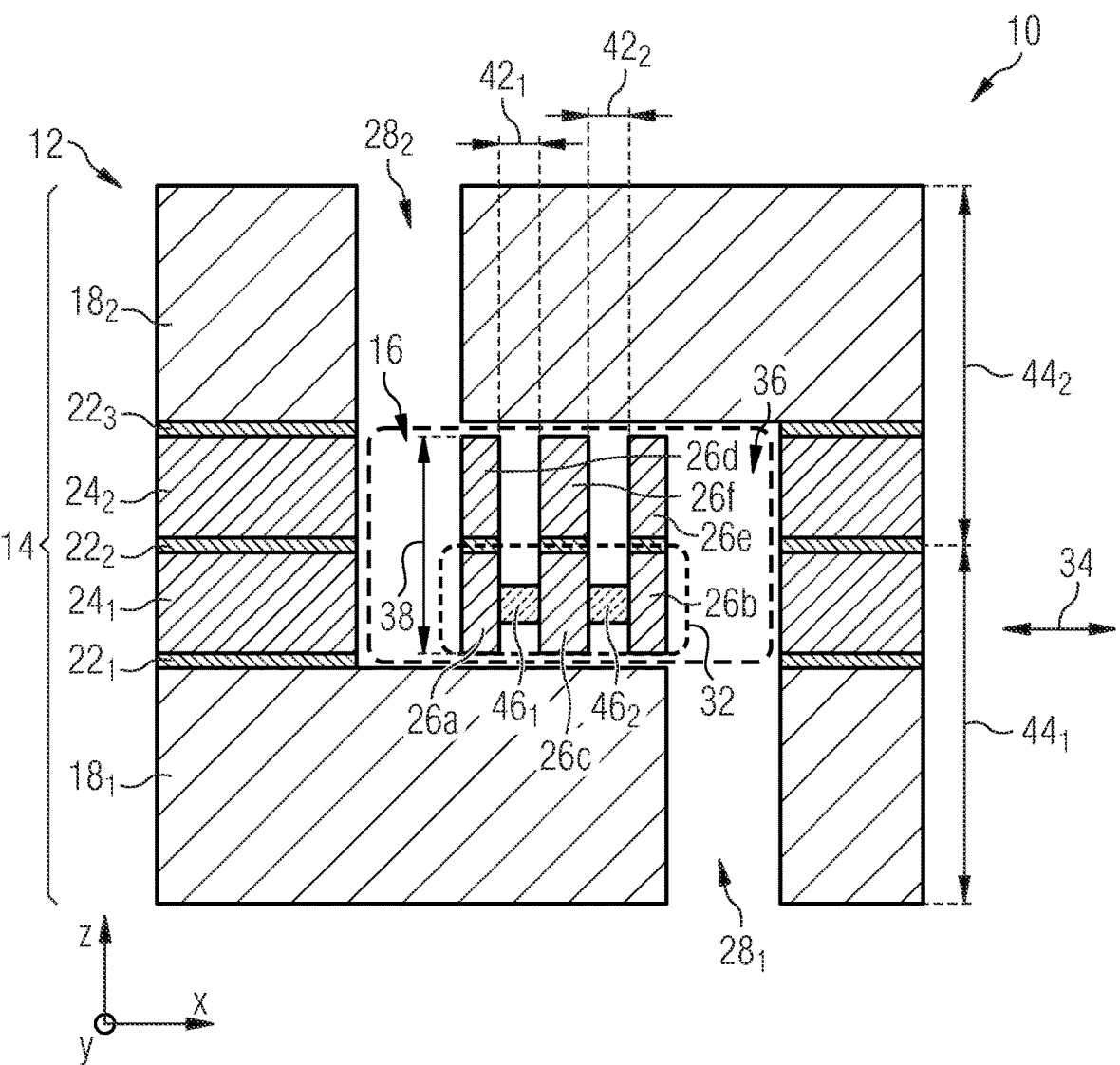
FIG. 1 is a schematic cross-sectional view of an MEMS according to an embodiment.

FIG. 1 shows a schematic cross-sectional view of an MEMS 10 according to an embodiment. The MEMS 10 includes a substrate 12 comprising, for example, a layer stack 14 of several individual layers, wherein the substrate 12 comprises, by partially removing individual layers, a cavity 16 arranged inside the substrate 12.

Figure 11A:
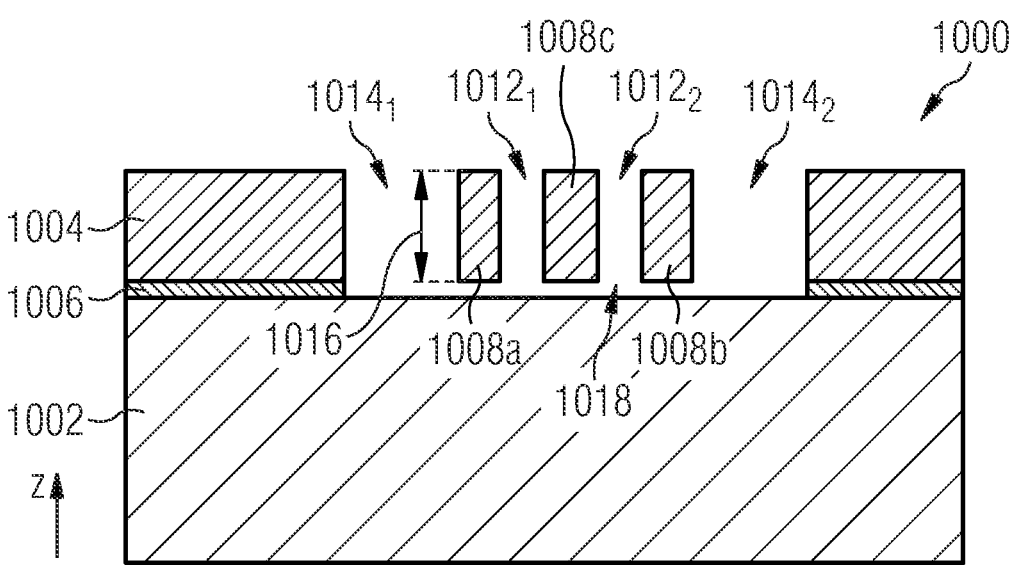
FIG. 11a is a schematic cross-sectional view or a cross-section to a known MEMS configured as L-NED.

The layer stack 14 can include several layers. For example, the layer stack 14 can comprise a first substrate layer $18_1$, where an active layer or a device layer $24_1$ is arranged by means of an intermediate layer $22_1$, such as by bonding, wherein the layer sequence $18_1$, $22_1$ and $24_1$ can correspond, for example to the layer stack illustrated in FIG. 11a regarding the used materials and/or dimensions. Via a further intermediate layer $22_2$, a further active layer $24_2$ can form part of the layer stack. Via an intermediate layer $22_3$, a further substrate layer $18_2$ can form part of the layer stack 24. The layer sequence $18_2$, $22_3$ and $24_2$ can mirror, for example, at least with respect to the layer types and layer order, possibly also with regard to the dimensions, the layer sequence $18_1$, $22_1$ and $24_1$ such that two half layer stacks are connected to one another by means of the intermediate layer $22_2$.

Here, the illustrated layer stack is merely exemplarily. The substrate layers $18_1$ and $18_2$ can, for example, correspond to the layers 1002 and 1032. Here, the intermediate layers $22_1$, $22_2$, and/or $22_3$ can be formed as intermediate layer 1006.

The layer stack 14 may include different and/or additional layers and/or may not include one or several of the illustrated layers. Therefore, it may be possible to not arrange the substrate layer $18_1$ or $18_2$ or to generate, via a different substrate, for example a printed circuit board or the same, where the further layers are arranged. Despite the lack of the layer $18_1$ and/or $18_2$ the cavity 16 can still be obtained in the substrate 12.

Exemplarily, the MEMS 10 is configured such that two active layers $24_1$ and $24_2$ are connected to one another via the intermediate layer $22_2$. The active layers $24_1$ and/or $24_2$ can, for example, comprise electrically conductive materials, for example doped semiconductor materials and/or metal materials. The layered arrangement of electrically conductive layers enables a simple configuration since the cavity 16 can be obtained by selectively removing out of the layer $24_1$ and $24_2$, as well as the intermediate layer $22_2$, and electrode structures 26a to e can remain by a suitable adjustment of the processes. Alternatively, it is also possible to arrange the electrode structures 26a to 26f completely or partly in the cavity 16 by other measures or processes, such as by generating and/or positioning in the cavity 16. In that case, the electrode structures 26a to 26f can be formed differently compared to the parts of the layer 24₁ and 24₂ remaining in the substrate 12, i.e. the same can comprise different materials.

The substrate layers 18₁ and 18₂ can comprise openings 28₁ or 28₂, which can each provide fluidic inlets and/or fluidic outlets as described for the openings 1026 and 1034.

Therefore, the MEMS 10 can comprise the MEMS 2000 through at least one additional layer, which is formed as active layer according to an illustrated embodiment and, for example, forms the layer 24₂.

Figure 11B:
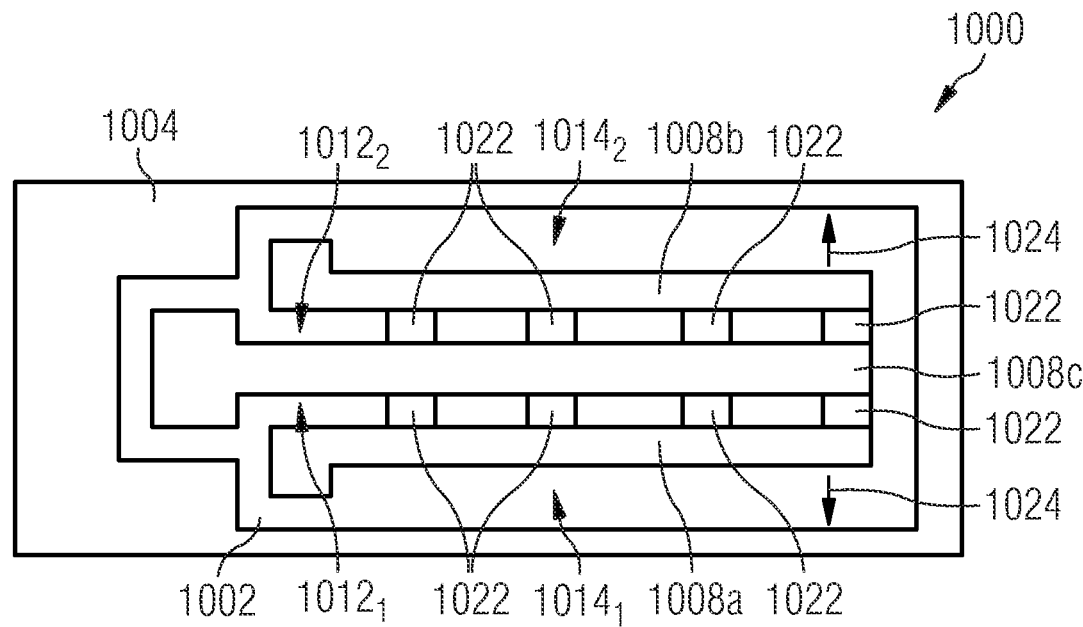

The electrodes 26a, 26b and 26c can be fixed to one another at discrete areas in an electrically insulated manner, such as described for the MEMS 1000 in FIG. 11b where partial elements of the resistor structure are arranged on at least two of the electrodes. In response to an electrical potential between the electrodes 26a and 26c, and/or in response to an electrical potential between the electrodes 26b and 26c, a movement of the movable element 32 obtained by the mechanical fixing at the discrete points along a direction of movement 34 can be obtained, which can correspond, for example, to the direction 1024 and can be arranged in the x/y plane of a Cartesian x/y/z coordinate system. The x/y plane can be the claim defining the in-plane movement along which the direction of movement 34 takes place.

The electrodes 26d to 26f can be remaining parts of the layer 24₂ and are arranged perpendicular to the substrate plane x/y adjacent to the layer 24₁. The electrodes 26a to 26c form at least partly a first layer of a layer arrangement 36, wherein the electrodes 26d to 26f at least partly form a second layer of the layer arrangement 36.

Compared to the dimension 1016, a dimension 38 of the movable layer arrangement 36 along the z direction can be enlarged, although gaps 42₁ between electrodes 26a and 26c or 26d and 26f and gaps 42₂ between electrodes 26b and 26c or 26e and 26f have the same or comparable dimension as in the MEMS 2000 since the same processes can be used. An aspect ratio between gap dimension 42₁ and 42₂ and the dimension of the electrodes 26a to 26c or 26d to 26f along the z direction can, for example, be the same or similar as described for the MEMS 2000 and can have, for example, a value of less than 40, in particular approximately 30. However, the actual effective aspect ratio can be higher, since the dimension 38 is increased, e.g. doubled, along the z direction by arranging the layers or electrodes 26a to 26f side by side without enlarging the gaps 42₁ and 42₂.

Here, a partial dimension or partial height 44₁ and 44₂ in parallel to the z direction of the MEMS 10 of the respective half layer stack 14 combined via the intermediate layer 22₂ can correspond approximately to a respective dimension of the MEMS 1000 along the z direction.

Here, a movement of the electrodes 26d to 26f can be obtained in different ways. By mechanically combining the electrode 26a and the electrode 26d, for example, the electrode 26b and the electrode 26e and/or the electrode 26c and the electrode 26f in pairs, a respective movement of the mechanically firmly connected other electrode can be obtained directly from the movement of the electrodes 26a, 26b or 26c of the movable element 32. Thereby, mechanical fixings 46₁ and 46₂, which can, for example, correspond to the elements 1022 of the MEMS 1000, can be omitted in the layer of the electrodes 26d to 26f. Alternatively or additionally, it is also possible to provide respective mechanical fixings 46 also in the plane of the layer 24₂ in order to mechanically fix the electrodes 26d to 26f at discrete locations or areas. Thereby, a further movable element can be obtained, which can be mechanically firmly connected to the movable element 32 via the intermediate layer 42₂, wherein a respective connection can also be fully or partly omitted.

In other words, the ratio between L-NED height and L-NED gap can be doubled, for example by bonding two device wafers 24₁ and 24₂ instead of bonding a device wafer (layer 22) with a lid wafer (layer 18₁), as illustrated in FIG. 1, so that FIG. 1 shows two device wafers that are bonded, so that the L-NED beams are mechanically connected to one another. In that way, the aspect ratio of the L-NED actuator is doubled. This solution provides several advantages:

in micro loudspeakers, for example, doubling the aspect ratio can result in an increase of the sound level by 6 dB;

the doubled L-NED height can result in a higher bending strength along the z direction, which again results in a lower sensitivity for the vertical (along the z direction) pull-in effect and enables a high degree of design freedom. This enables, for example, that the L-NED beams can be made longer, this means the same can have a high axial extension along the y direction. Alternatively or additionally, the L-NED beams can be clamped on one side instead of on two sides, which is advantageous since L-NED beams clamped on one side enable greater deflection than, for example, L-NED beams clamped on two sides;

although it is still possible, a lid is not absolutely needed according to known configurations, which provides saving potentials.

Figure 12:
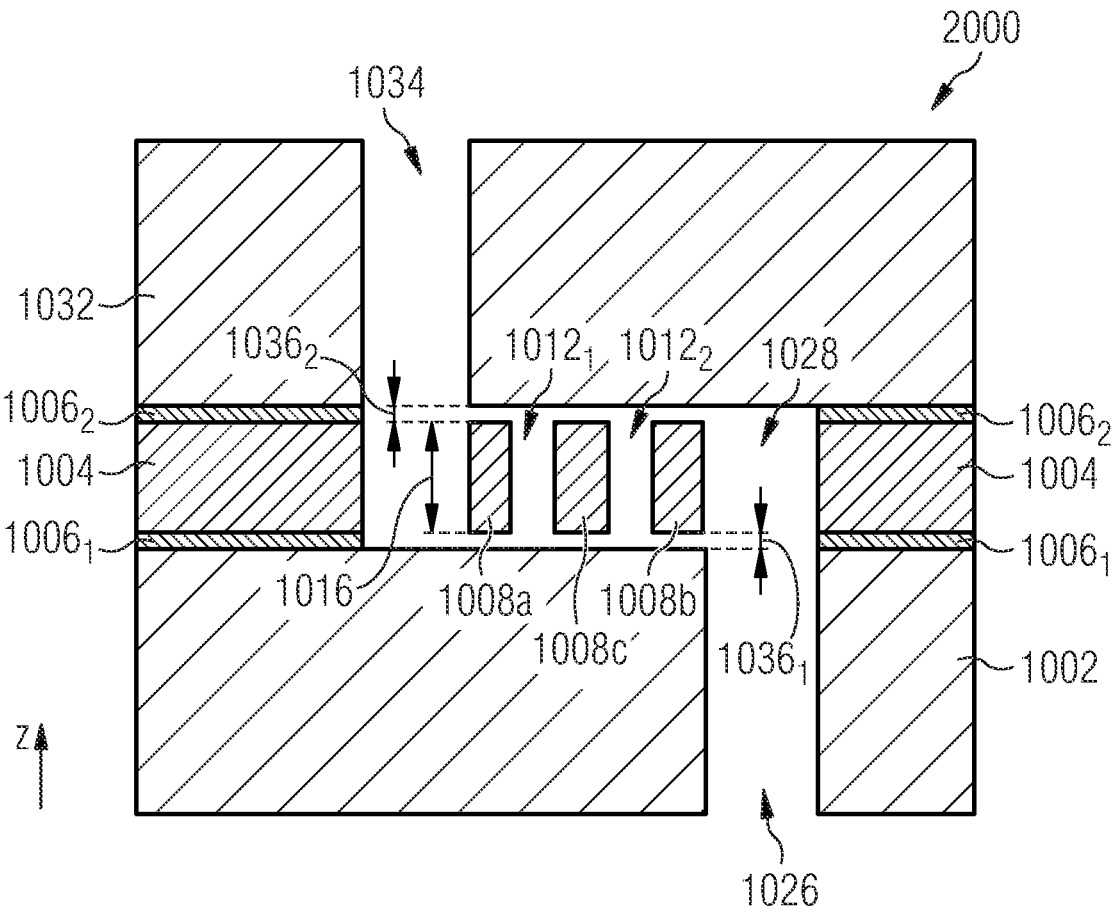
FIG. 12 is a schematic cross-sectional view of a further known MEMS.

If, for example, with renewed reference to a known MEMS according to FIG. 12, a device wafer of the layers 1002, 10061 and 1004 (referred to as technology 1) and a lid wafer 1032 (referred to as technology 2) are bonded by means of layer 10062 for a loudspeaker or a pump. Here, two different technologies or production steps are needed for producing lid and device wafer. In comparison, the MEMS 10 according to FIG. 1 can be produced by using only one of these technologies (technology 1), since both components that are bonded (44₁ and 44₂) are device wafers and are hence produced with the same technology 1. This means using technology 2 can be omitted, which enables simple production. The role of the lid wafer is now fulfilled by 18₂.

Here, it should be noted that terms like lid or bottom are merely used for better distinction between individual elements of MEMS described herein and are not limiting neither with regard to a specific design nor with regard to an orientation of the layers in space. Further, it should be noted that the exemplarily discussed doubling of the dimension along the z direction is one of the possible configurations. The layers 24₁ and 24₂ can have the same or differing dimensions which relates both to the area in the substrate 12 as well as to the area in the cavity 16.

Figure 2:
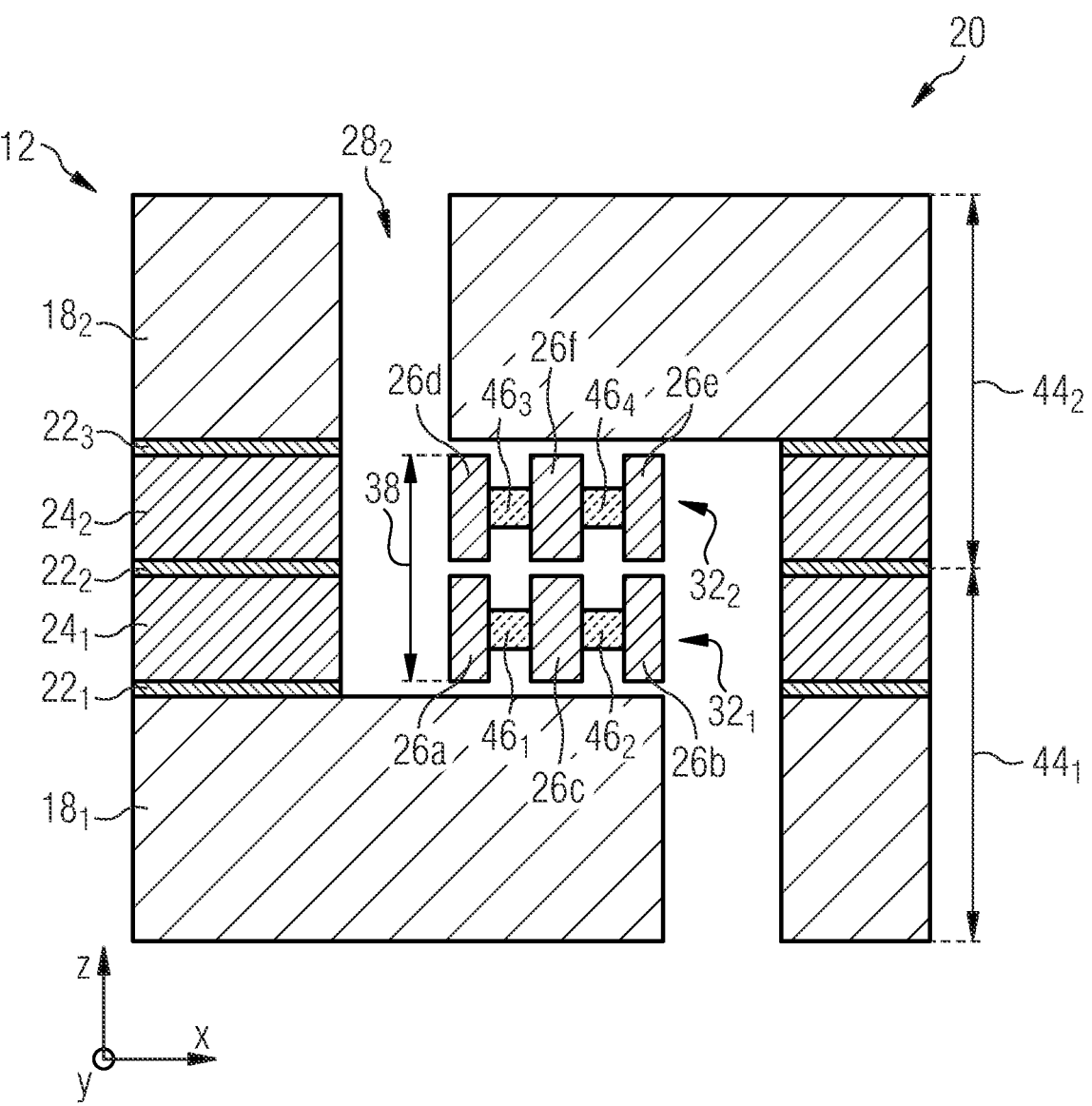
FIG. 2 is a schematic cross-sectional view of an MEMS according to an embodiment, wherein additional actuator thickness is obtained by additional electrodes.

FIG. 2 shows a schematic cross-sectional view of an MEMS 20 according to an embodiment, wherein the intermediate layer 22₂ is removed between electrodes 26a, 26b and 26c on the one hand and 26d, 26e and 26f on the other hand.

Like in the MEMS 10, the active layer 24₂ is structured into electrodes 26d, 26e and 26f that are arranged along the z direction perpendicular to the substrate plane adjacent to the electrodes 26a, 26b or 26c, at least in the illustrated hollow state, however, the electrodes 26d and 26f can be mechanically firmly connected to one another at a discrete location via mechanical fixings 46₃ and the electrodes 26e and 26f via mechanical fixings 464, such that, with regard to the missing or removed intermediate layer $22_2$, the layer arrangement 2 can comprise movable elements $32_1$ and $32_2$, which results in the same or comparable effective dimension 38 along the z direction, but enables a different control of the movable elements.

According to an embodiment, differing electrical potentials can be applied between the electrode 26a and 26c on the one hand and between the electrodes 26d and 26f on the other hand. Alternatively or additionally, different electrical potentials can be applied between the electrodes 26b and 26c on the one hand and between the electrodes 26e and 26f on the other hand, which can result in differing movements of the movable elements $32_1$ and $32_2$. This means that the respective electrodes are galvanically separated and/or are only contacted in an optional control means, such as an application-specific integrated circuit (ASIC).

In other words, the L-NED beams of the upper device wafer are not directly connected to the L-NED beam of the bottom device wafer. The two L-NED beams can be separately controlled.

Figure 3A:
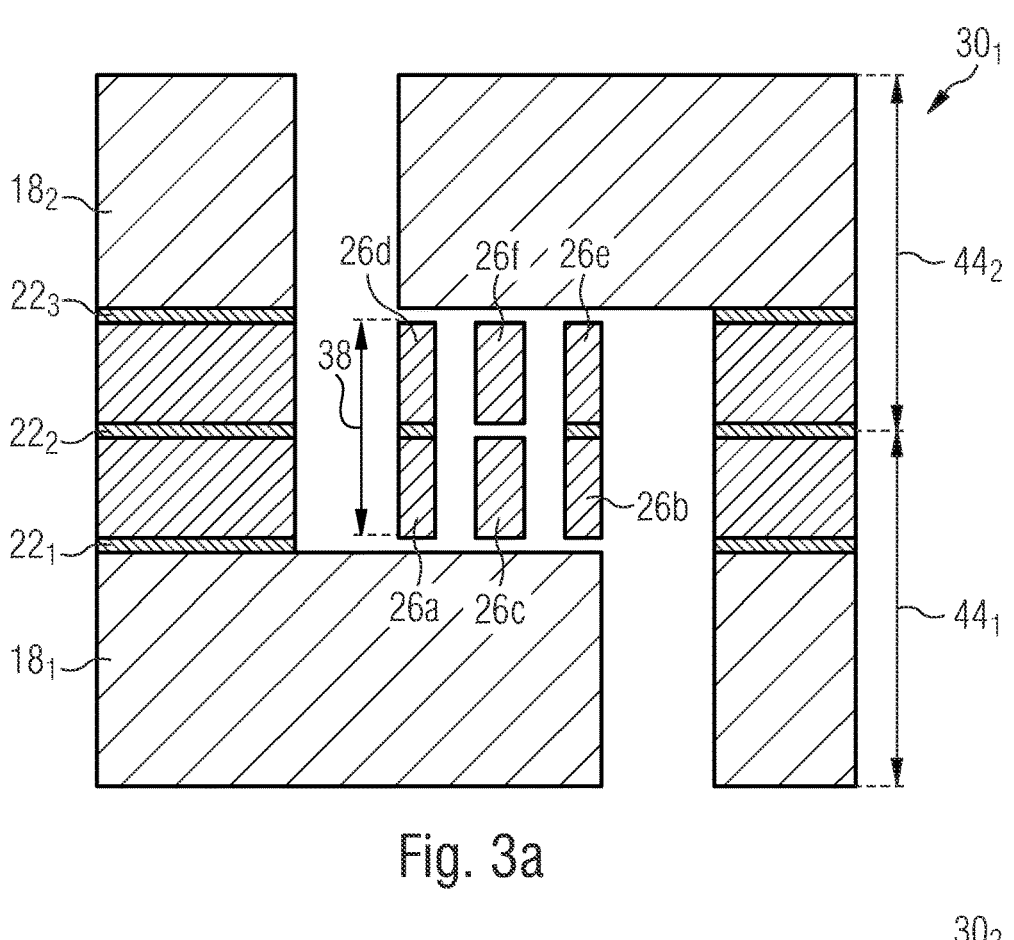
FIG. 3a is a schematic cross-sectional view of an MEMS according to an embodiment, wherein the external electrodes of a first and a second layer are connected to one another via an intermediate layer, while in internal electrodes the intermediate layer is fully or completely removed or not arranged.

FIG. 3a shows a schematic cross-sectional view of an MEMS $30_1$ according to an embodiment providing a combinational configuration of the MEMS 10 and 20, wherein the electrodes 26a and 26b as well as the electrodes 26b and 26e are connected to one another via the intermediate layer $22_2$, while the intermediate layer $22_2$ between the electrodes 26c and 26f is completely or partly removed or not arranged in order to space the electrodes 26c and 26f apart from one another. This results in a common movement of the electrodes 26a and 26d as well as 26b and 26e, such that the mechanical fixings 46 (not illustrated in FIG. 3a) can be arranged on any locations, such as according to the configuration of FIG. 2, wherein, for example, it is also possible to omit individual mechanical fixings since a transfer of movement can also take place by the intermediate layer $22_2$ between the electrodes.

Figure 3B:
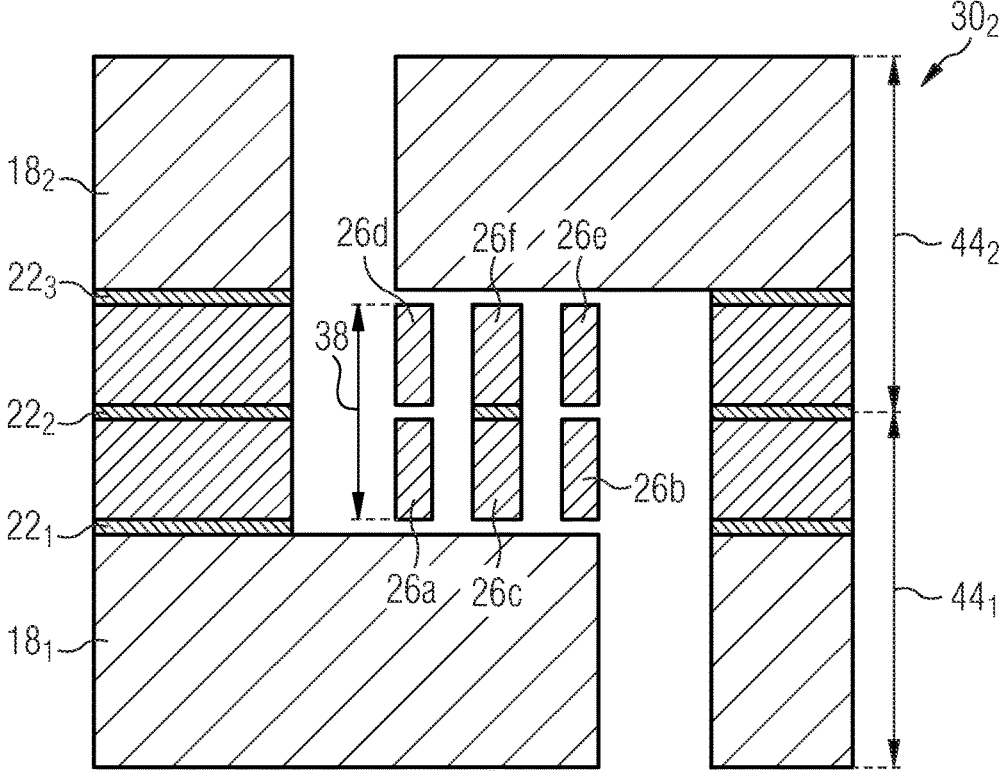
FIG. 3b is a schematic cross-sectional view of an MEMS according to an embodiment, wherein compared to the MEMS of FIG. 3a, the intermediate layer is arranged between the internal electrodes to mechanically connect the two electrodes firmly to one another, but is removed between the external electrodes.

FIG. 3b shows a schematic cross-sectional view of an MEMS $30_2$ according to an embodiment, wherein, compared to the MEMS $30_1$, the intermediate layer $22_2$ is arranged between the electrodes 26c and 26f in order to mechanically firmly connect the two electrodes, but is removed between the electrodes 26a and 26b and/or between the electrodes 26b and 26e. Here, also, some of the mechanical fixings 46 illustrated in FIG. 2 can be omitted, for example between the electrodes 26a and 26c and between the electrodes 26e and 26f or between the electrodes 26b and 26c and between the electrodes 26d and 26f. A transfer of movement can take place via the mechanically fixed connection between the electrodes 26c and 26f.

In other words, the L-NED beams of the top device wafer may only be partly directly connected to the L-NED beams of the bottom device wafer, according to FIG. 3b only the middle electrodes and according to FIG. 3a only the external electrodes.

Embodiments provide any configurations where at least one pair of electrodes of the electrodes 26a and 26d, the electrodes 26b and 26e and the electrodes 26c and 26f are mechanically firmly connected to one another via an intermediate layer $22_2$ arranged between the layers. Optionally, this layer can also be completely removed as described based on FIG. 2.

The above-described MEMS 10, 20, $30_1$ and $30_2$ include two actively formed layers that are arranged on or stacked on top of one another in order to increase the aspect ratio between dimension 38 and gap 42. Although these MEMS are described by using two active layers that are connected to one another by means of an intermediate layer, such as silicon oxide or silicon nitride or polymer or the same, embodiments are not limited thereto but also enable the arrangement of additional further layers in any number, such as three or more, four or more, five or more, or higher.

In the following, reference is made to further embodiments of the present invention where the aspect ratio is increased by other, possibly passive, layers.

Figures 4A, 4B, 4C:
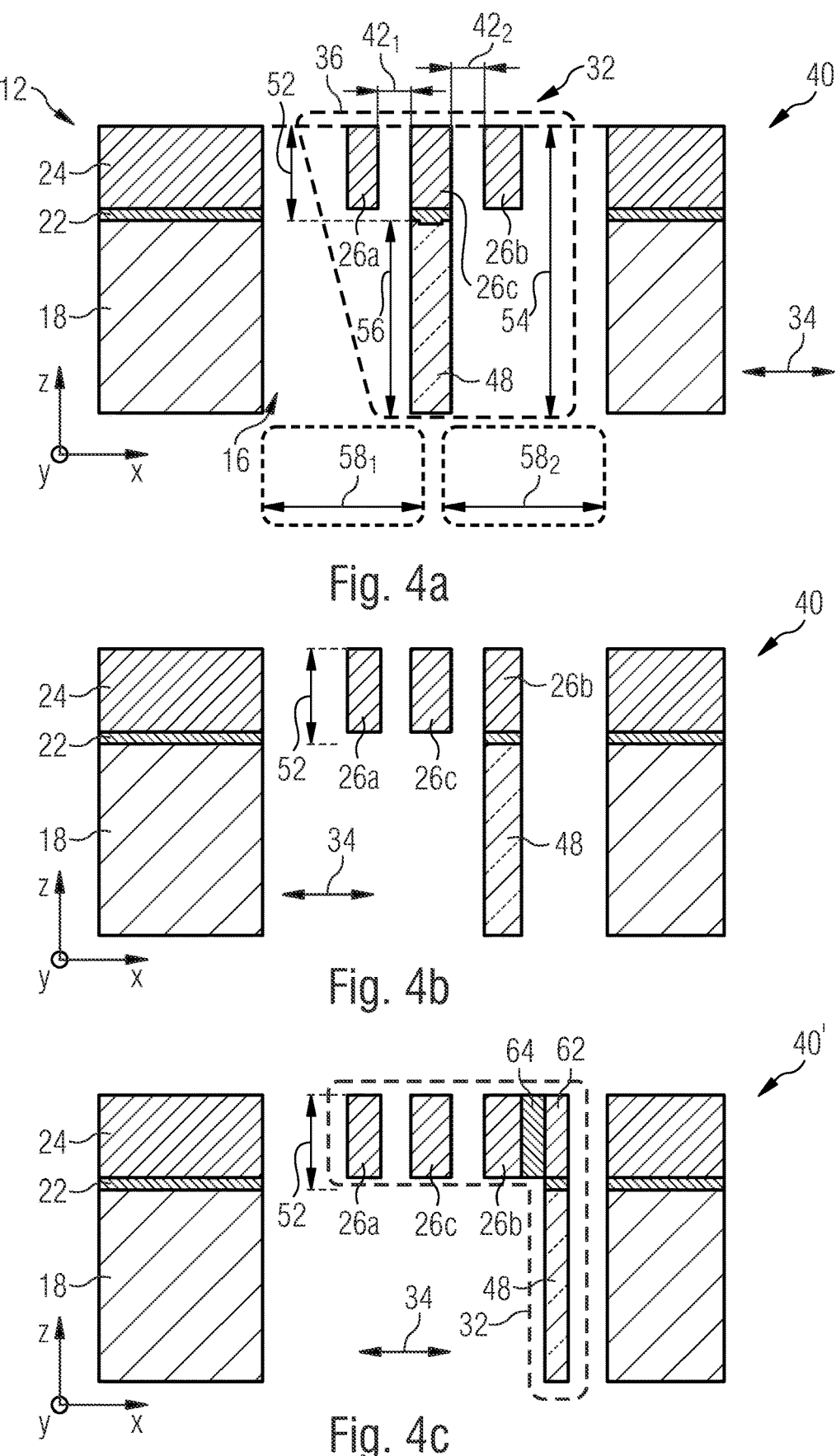
FIG. 4a is a schematic cross-sectional view of an MEMS according to an embodiment, wherein the second layer of a movable layer arrangement includes a resistor structure formed, for example, of a substrate layer.
FIG. 4b is a schematic cross-sectional view of the MEMS of FIG. 4a, wherein the resistor structure is mechanically firmly connected to an external electrode.
FIG. 4c is a schematic cross-sectional view of an MEMS according to an embodiment, wherein the movable element comprises a piggyback element in a plane of the electrodes of the first layer, to which the resistor structure is mechanically firmly connected via a coupling element.

FIG. 4a shows a schematic cross-sectional view of an MEMS 40 according to an embodiment, wherein the second layer of the movable layer arrangement 36 includes a resistor structure 48 formed, for example, of the substrate layer 18 that remains, is arranged or is not removed from the area of the cavity 16 and is connected to at least one of the electrodes 26a, 26b and/or 26c in order to provide an additional fluidic resistor with respect to the electrodes 26a, 26b and 26c. For example, the resistor structure 48 can be maintained during a selective etching method. Compared to a height 52 of the electrodes 26a, 26b and 26c along the z direction that can correspond, for example, to the height $1016$, an effective height 54 of the movable element 32 can be increased by the resistor structure 48, which is advantageous.

The dimension 52 can, for example, be between 1 μm and 1 mm, advantageously between 50 μm and 400 μm, and most advantageously between 70 μm and 150 μm. With reference to FIG. 1, this can result in a dimension 38 of approximately twice the size, since the intermediate layer $22_2$ is added, which can have a dimension of several μm, such as 1 μm, 2 μm or 10 μm. In that way, the dimension 56 can also be at least 50 μm, at least 100 μm or at least 200 μm.

Here, a height or dimension 56 of the resistor structure 48 can be very large, in particular when considering a selective arrangement of the resistor structure 48 along an x direction at a location of the y axis. In that way, an aspect ratio used for this, which is described by gaps or voids $58_1$ between the substrate layer 18 and the resistor structure 48 and/or $48_2$ between the substrate layer 18 and the resistor structure 48 with respect to the height 56 of the resistor structure 48 can also have a value of approximately the limiting ratio of less than 40, for example less than 35 or less than 30 or less, i.e. the dimension 52 can be greater than the gaps $42_1$ and/or $42_2$ by this factor. Considering the gaps $58_1$ to $58_2$ that are much greater than the gaps $42_1$ and/or $42_2$ between the electrodes 26a to 26c, this aspect ratio can result in dimensions 56 along the z direction that are also much greater when compared to the dimension 52. The dimension 56, which can also be referred to as layer thickness of the layer 18 in the area of the cavity and, hence, the resistor structure can be greater than the dimension 52 of the layer 24 in the area of the electrodes 26a to 26c by a factor of at least 2, at least 3, at least 4 or more.

In other words, FIG. 4a shows the L-NED beams with rear structure, where the rear structure is placed below the middle electrode.

While in FIG. 4a the resistor structure of one of the middle electrodes 26c of the movable element 32 is arranged, FIG. 4b illustrates a schematic cross-sectional view of the MEMS 40 where the resistor structure 48 is mechanically firmly connected to the electrode 26b. Alternatively or additionally, at least part of the resistor structure 48 can also be mechanically firmly connected to the electrode 26a, such as via the intermediate layer 22.

The illustrations according to FIGS. 4a and 4b can relate to different MEMS where the resistor structure 48 is exclusively arranged on one of the electrodes 26b or 26c. Alternatively, the resistor structure 48 can also be structured such that the illustrations of FIG. 4a and FIG. 4b show different positions along the y axis as will be shown in more detail below.

The resistor structure 48 or partial elements thereof are mechanically firmly connected to the movable element 32, such that the resistor structure 48 is moved together with the movable element 32.

In other words, FIG. 4b shows the rear structure placed below the external electrode in cross-section.

FIG. 4c shows a schematic cross-sectional view of an MEMS 40' according to an embodiment, wherein the movable element 32 comprises a piggyback element 62 in a plane of the electrodes 26a to 26c to which the resistor structure 48 is mechanically firmly connected, such as by part of the intermediate layer 22. The piggyback element 62 can consist of the same material as the layer 24, i.e. the electrodes 26a to 26c, but can also be formed of a differing material. For example, a coupling element 64 providing the mechanical fixing can be arranged between the electrode 26b to which the piggyback element 62 is mechanically firmly connected and the piggyback element 62. The coupling element 64 can, for example, provide electrical insulation, which is, however, optional. It is also possible that the coupling element 64 represents at least a local widening along the x direction across at least an area along the y direction, such as in the sense of a local thickening, which can result, however, in asymmetries with regard to the generated electrostatic forces. Advantageously, the piggyback element 62 is arranged on a side of the electrode 26b facing away from the electrode 26c. Alternatively, the piggyback element 62 can also be mechanically firmly connected to the electrode 26a, advantageously on a side facing away from the electrode 26c. Both implementations can also be combined and can be combined with the statements in connection with the MEMS 40, this means the resistor structure 48 can be arranged completely or partly on the piggyback element 62.

The coupling element 64 and/or the local widening can be arranged in area along the y direction which is at most slightly deformed when the active element or the movable element 32 is deformed, which can be an area of maximum deflection of the movable element. This means the coupling element 64 is not arranged where a large degree of material strain of the movable element takes place. Movement amplitudes or strain amplitudes between the area of at most slight deformation and the area of active deformation can provide, for example, a ratio of 2:1, 3:1 or 4:1.

Similar to the MEMS 40, a distance between the resistor structure 48 and the substrate, the layer 18, can be greater than the distance between the electrodes described by the gaps 42₁ and 42₂. The distance can be greater than the second distance by a factor of at least three, advantageously by a factor of at least four or at least 16.

The resistor structure 48 can provide a fluidic resistor for a fluid arranged in the cavity 16. Although the MEMS 40 and the MEMS 40' are illustrated such that the resistor structure 48 is arranged merely on one side of the electrode structures 26a to 26c along the negative z direction, these embodiments also relate to arranging the resistor structure along the positive z direction. Further embodiments relate to a combination of both implementations, such that a further resistor structure is arranged, which is arranged on both sides along positive and negative z directions of the layer 24 and electrodes 26a to 26c, respectively.

For controlling a direction of movement of the fluid out of the cavity 16, for example, the additional lid layers 18₁ and/or 18₂ illustrated, for example in FIGS. 3a and 3b can be arranged and provided with respective openings. Although the openings in the embodiments described herein are illustrated as part of the external layers of the layer stack, alternatively or additionally, openings can be provided laterally, for example in the layers 24₁ and/or 24₂ of the MEMS 10, 20, 30₁ or 30₂ and/or in the layer 24 and/or 18 of the MEMS 40 or 40'. This enables omission of a respective lid layer with openings and/or other usage of respective silicon area.

It should be noted that the mechanical fixings 46 are not illustrated in FIGS. 4a, 4b and 4c. In other words, FIG. 4c shows the rear structure placed laterally to the electrodes in a cross-section.

Figure 4D:
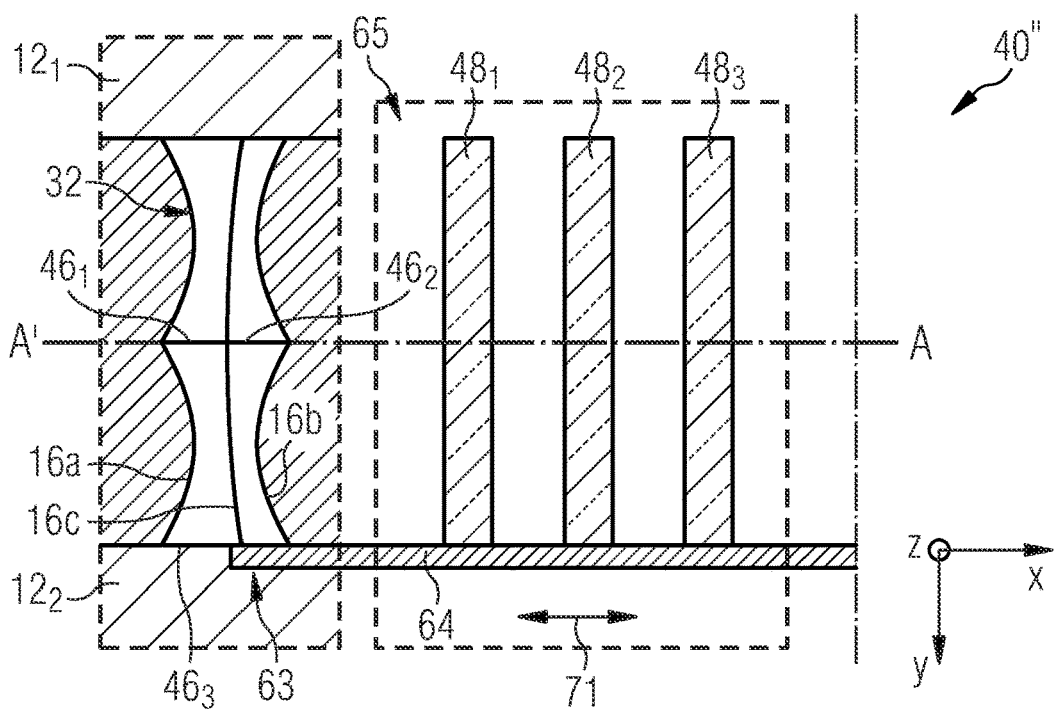
FIG. 4d is a schematic top view of an MEMS according to a further embodiment, wherein the coupling element is arranged on a freely deflectable end of the movable element clamped on one side of the substrate.

FIG. 4d shows a schematic top view of an MEMS 40'' according to a further embodiment, wherein the coupling element 64 is arranged on a freely deflectable end of the movable element 32 clamped on one side of the substrate 12₁ which connects the movable element or the freely deflectable end thereof to a plurality of resistor structures 48₁, 48₂, which form a comb structure that is movable in a depression 65 of the cavity of the MEMS.

Figure 4E:
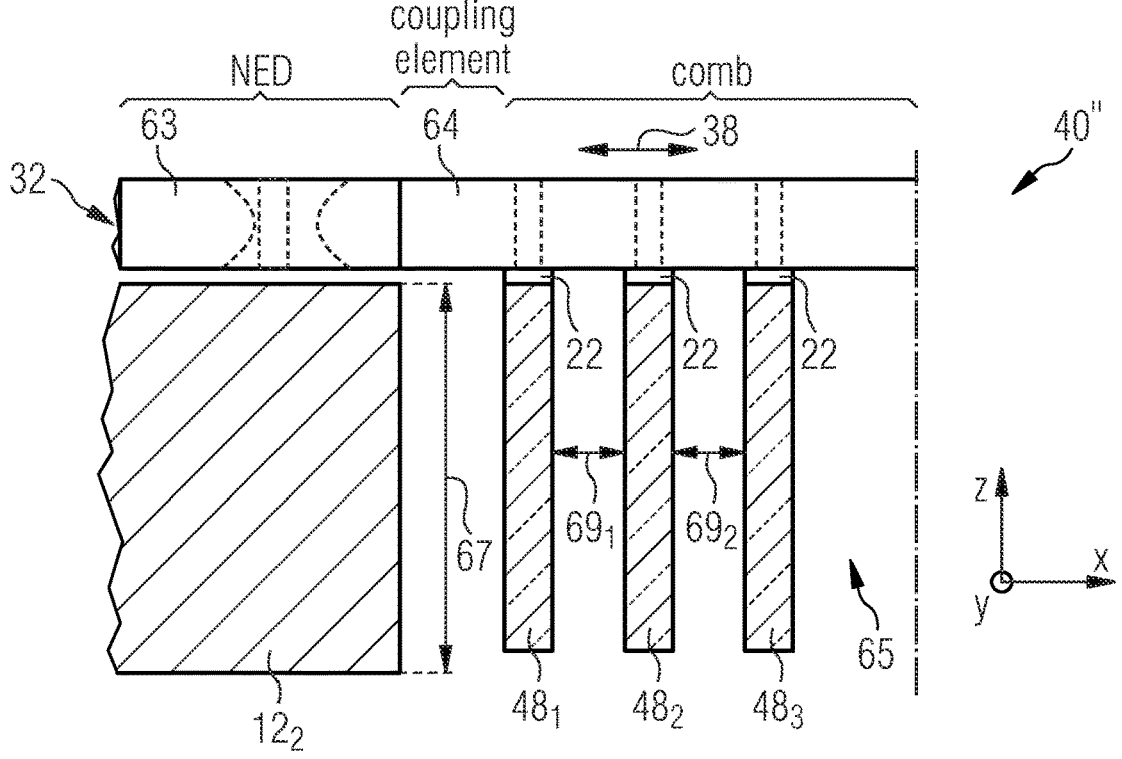
FIG. 4e is a schematic cross-sectional view of the MEMS of FIG. 4d in a sectional plane A'A of FIG. 4d.

FIG. 4e shows a schematic cross-sectional view of the MEMS 40'' of FIG. 4d in a sectional plane A'A of FIG. 4d, where it becomes clear that the movable element 32 moves along the z direction adjacent to a substrate 12₂, and performs, such as above the substrate, a wiping movement parallel to the direction of movement 38. Via the coupling element 64 on which the resistor elements 48₁, 48₂ and 48₃ are arranged, for example by using the intermediate layer 22, the resistor elements can also be moved along the direction of movement 38 in the depression 65 of the cavity. The depression 65 can be limited laterally along the x direction by the substrate 12₂, such that a respective aspect ratio or a dimension of the movable element 32 and/or the electrodes thereof along the z direction can be prevented. The substrate 12₂ comprises, for example a dimension 67 that is greater than 75 μm, greater than 150 μm or greater than 300 μm, for example the same size as the resistor structures 48₁, 48₂ and 48₃. This means that instead of direct fluidic interaction by means of the movable element 32, indirect actuation or sensing via the comb structures, the resistor structures 48₁ to 48₃ takes place which can be configured respectively large due to the large distances 69₁ and 69₂ between the resistor structures 48₁ to 48₃ while maintaining the respective aspect ratios. The coupling element 64 enables a transfer of the movement of the movable element 32 to the comb structure.

In other words, the rear structure is mounted on a movable, but not deformed part of the coupling element 64, which is moved at the movable element, the NED, which is deformed. Thereby, an increase in stiffness in lateral deflection direction for the deformed structure may not be actorically effective, i.e. can be prevented and, hence, no reduction of deflection can occur. However, the advantage of the reduced vertical pull-in effect or risk is maintained. Here, the increase in stiffness by the resistor structures becomes effective. The connection of NED and rear structure is made via a coupling element. Here, the number of resistor structures in the MEMS 40'' is any number ≥1. A lateral dimension 71 of the comb structure along the direction of movement 38 can be greater than 150 μm, greater than 300 μm or greater than 600 μm, for example 725 μm.

Figure 5A:
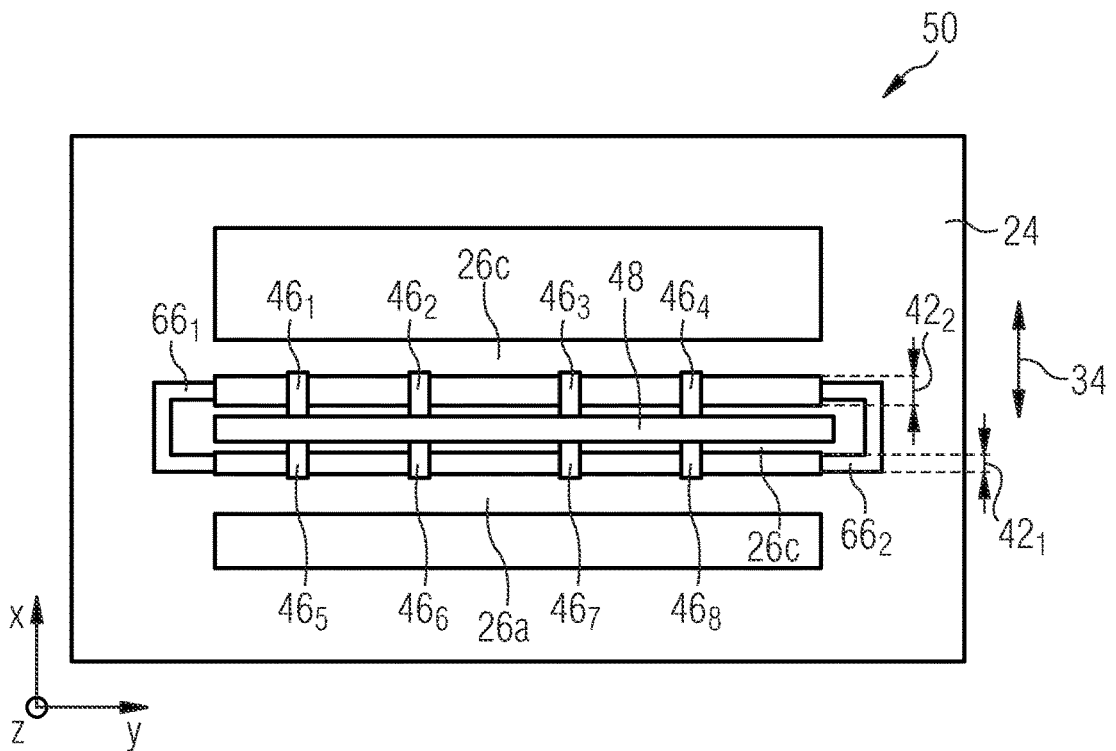
FIG. 5a is a schematic view of an MEMS according to an embodiment, wherein the movable element is firmly clamped on two sides.

FIG. 5a shows a schematic view of an MEMS 50 according to an embodiment, for example a top view from a bottom side. The movable element including electrodes 26a, 26b and 26c that are mechanically firmly connected to one another via the mechanical fixings 46₁ to 46₈ at discrete locations can be firmly clamped on two sides. The electrodes 26a and 26c can be electrically and/or galvanically connected to one another, for example in that the same are formed from the same continuous layer 24. However, the electrode 26 can be electrically insulated from the electrodes 26a and 26b by using insulating areas 661 and 662 in order to enable application of an electrical potential differing from the electrodes 26a and 26b.

Figure 5B:
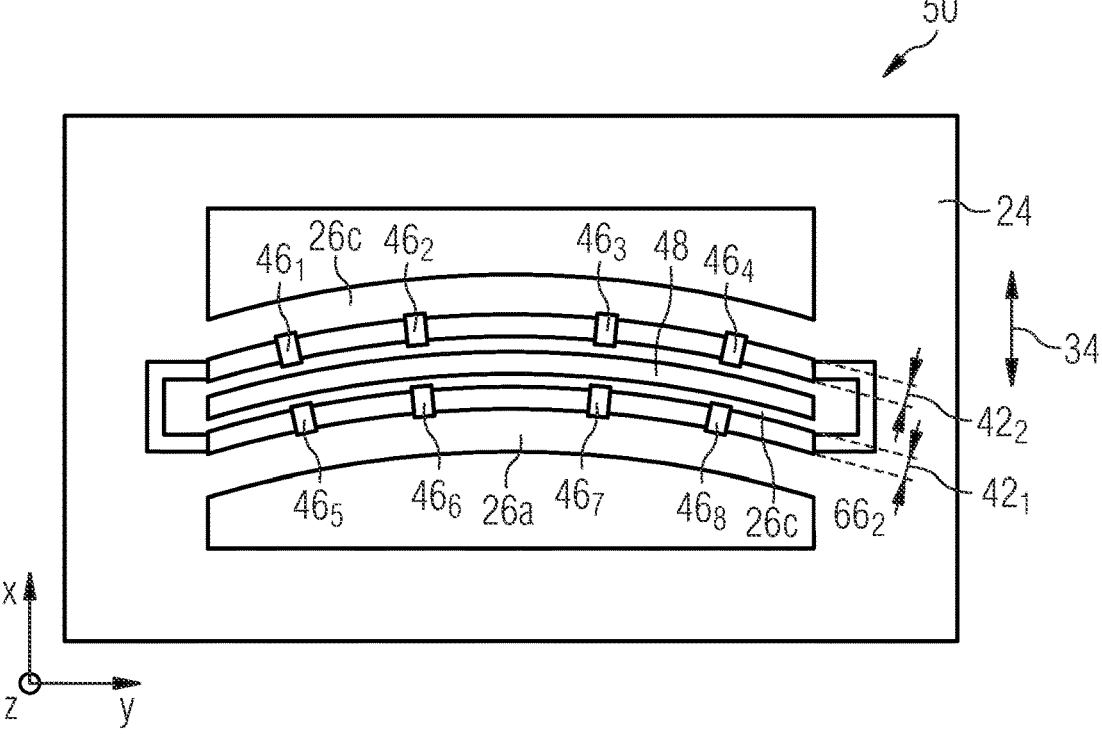
FIG. 5b is a schematic view of the MEMS of FIG. 5a in a deflected state of the movable element.

FIG. 5b shows a view of the MEMS 50 comparable to FIG. 5a, wherein the movable element is deflected in FIG. 5b. A bending direction of the movable element, such as along positive x direction, can be adjusted via an orientation of the mechanical fixings 46.

As described in the context of FIG. 4a, the resistor structure 48 can be mechanically firmly connected to the electrode 26c and can be moved together with the same. The view of FIG. 5b shows that the deflection of the movable element can also result in a deflection of the resistor structure 48, whereby a high degree of fluid can be moved as long as the MEMS 50 is actuator-operated. In a sensory mode of operation, a small degree of moved fluid, i.e. little force may be sufficient to cause the illustrated deflection.

An axial extension of the electrodes 26a, 26b and 26c and hence the movable layer arrangement parallel to the substrate plane and perpendicular to the direction of movement 34, for example along y can be at least a factor of 0.5, advantageously at least 0.6, and most advantageously at least 0.7 compared to a dimension of the movable layer structure along a thickness direction z. The dimension along y can, alternatively or additionally, have a value in a range of at least 10 µm and at most 5000 µm, advantageously at least 100 µm and at most 2000 µm and most advantageously at least 400 µm and at most 1500 µm.

Although the MEMS 50 is illustrated such that the movable element is clamped on two sides, clamping on one side is also possible.

In other words, the usage of a resistor structure is an additional or alternative option for increasing the efficiency of NED devices. In the illustrated case of the L-NED beam, the common aspect ratio of less than 30 or approximately 30 can be used, such that an NED gap 42 that is as small as possible is obtained. The embodiments are directed to additionally structure a passive rear structure or resistor structure on the front and/or rear of the L-NED beam. The rear structure is partly or completely connected to the L-NED beam. When the L-NED beam is moved, the rear structure is moved as well, thereby, much more liquid or air as fluid is moved than by the L-NED beam alone. Since the rear structure is directly connected to the L-NED electrodes, the rear structure takes exactly the same shape as the beam itself during the deflection of the L-NED beam. This means the deflection or curvature of the rear structure can be exactly the same as the one of an L-NED beam.

The rear structure can basically be made as high as desired, i.e. the dimension 56 can have any size. The same can, for example, be as large as the thickness of the handle wafer, this means, for example, at least 300 µm, at least 500 µm or at least 600 µm or more since this structure is no longer subject to the L-NED limitations, i.e. narrow gaps and aspect ratios <30. The rear structure can be structured from the rear of the BSOI wafer in a simple manner by broader gaps (trenches). The trenches on the rear are still subject to the production-specific limitations (for example a Bosch limitation having an aspect ratio of <30), however, since the trenches can be made broader, in particular when using only one resistor structure along the trench direction, the same can also be etched much deeper which results in the large dimension 56. Obviously, the rear structure can also be produced below the external L-NED electrodes 26a or 26b or even as separate structure in parallel to the L-NED beams as illustrated in FIG. 4c. According to a non-limiting example, the L-NED height 52 can be 75 µm and the rear structure height 600 µm. Thereby, a respective structure can move eight times more air than the L-NED structure alone. This corresponds to approximately 18 dB more sound pressure level in the case of a micro loudspeaker. This takes place under the assumption that the deflection of the L-NED beam is not significantly affected by the additional rear structure. For ensuring this, embodiments are designed to keep the stiffness of the rear structure in lateral direction, i.e. along the x direction or along the direction of movement 34 as low as possible, which can be obtained, for example, by a resistor structure 48 that is thin along this direction. An exemplary dimension of the resistor structure 48 along the direction 34 is, for example, to at most 100 µm, at most 50 µm or at most 1 µm. As long as the rear structure is mechanically stable, the rear structure can be made as thin as possible in order to not significantly affect the inertia and lateral bending stiffness of the entire system. The loss of the lateral deflection by connecting the rear structure to the L-NED beam can be alternatively or additionally compensated by using longer dimensions along the y direction and/or by a softer clamping representing additional freedom of design of the system.

In other words, FIGS. 5a and 5b show top views from the bottom, wherein the L-NED beams (clamped on two sides) are illustrated in a resting state or a non-deflected state and a deflected state. The rear structure 48 follows exactly the movement and/or the bending/curvature of the L-NED beam.

Figure 6A:
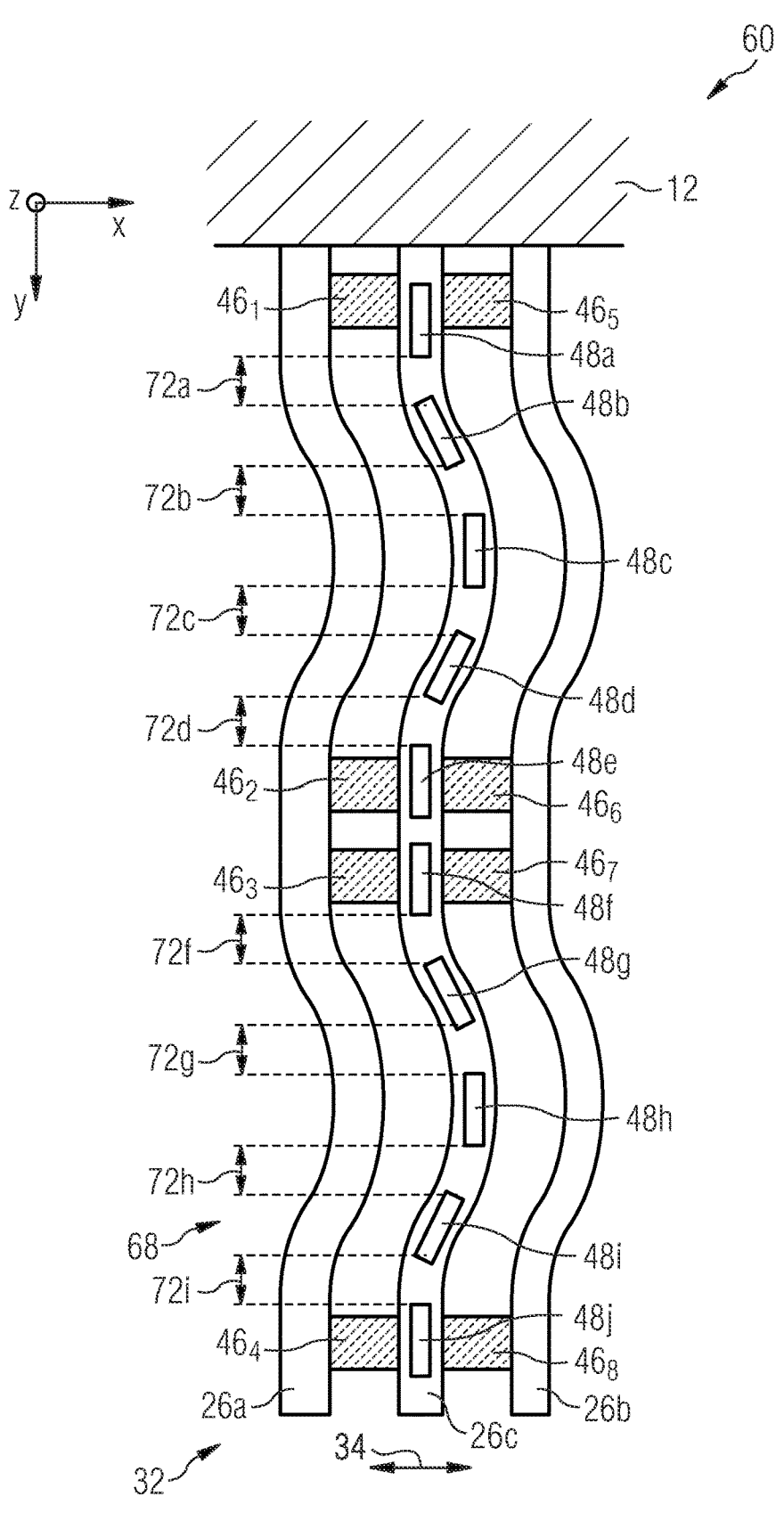
FIG. 6a is a schematic top view of an MEMS according to an embodiment, wherein partial elements of the resistor structure are arranged on one of the electrodes.

FIG. 6a shows a schematic top view of an MEMS 60 according to an embodiment, wherein the movable element 32 is arranged clamped on one side, whereby a free end 68 of the bending beam structure can have a comparatively greater deflection along the direction of movement 34 than a central area of the bending beam of the MEMS 50 clamped on two sides.

Independent thereof, the MEMS 60 comprises means for reducing a stiffness of the resistor structure 48. For this, the resistor structure can include any number of at least two, at least three, at least five or at least 10 or more partial elements 48a to 48j that are arranged on one or several electrodes 26a, 26b and/or 26c. In that way, for example the partial elements 48a to 48j are arranged on the central electrode 26c along an axial course along the y direction of the same. Based on the structuring of the resistor element 48, the partial elements 48a to 48j are spaced apart from one another by distances 72a to 72i which provides the reduction in stiffness, i.e. keeps the amount for an increase in stiffness by the resistor structure low or minimizes the same. The distances 72a to 72j can be equal or different and can be, for example, at most 100 µm, at most 50 µm or at most 5 µm to prevent fluidic losses or to at least keep them low when the partial elements 48a to 48j arranged perpendicular to the direction of movement 34 along the axial extension direction y move along the direction of movement 34.

According to alternative embodiments, the partial elements 48a to 48j of the resistor structure 48 can all be mechanically firmly connected either to the electrode 26a or to the electrode 26b or to the electrode 26c.

Figure 6B:
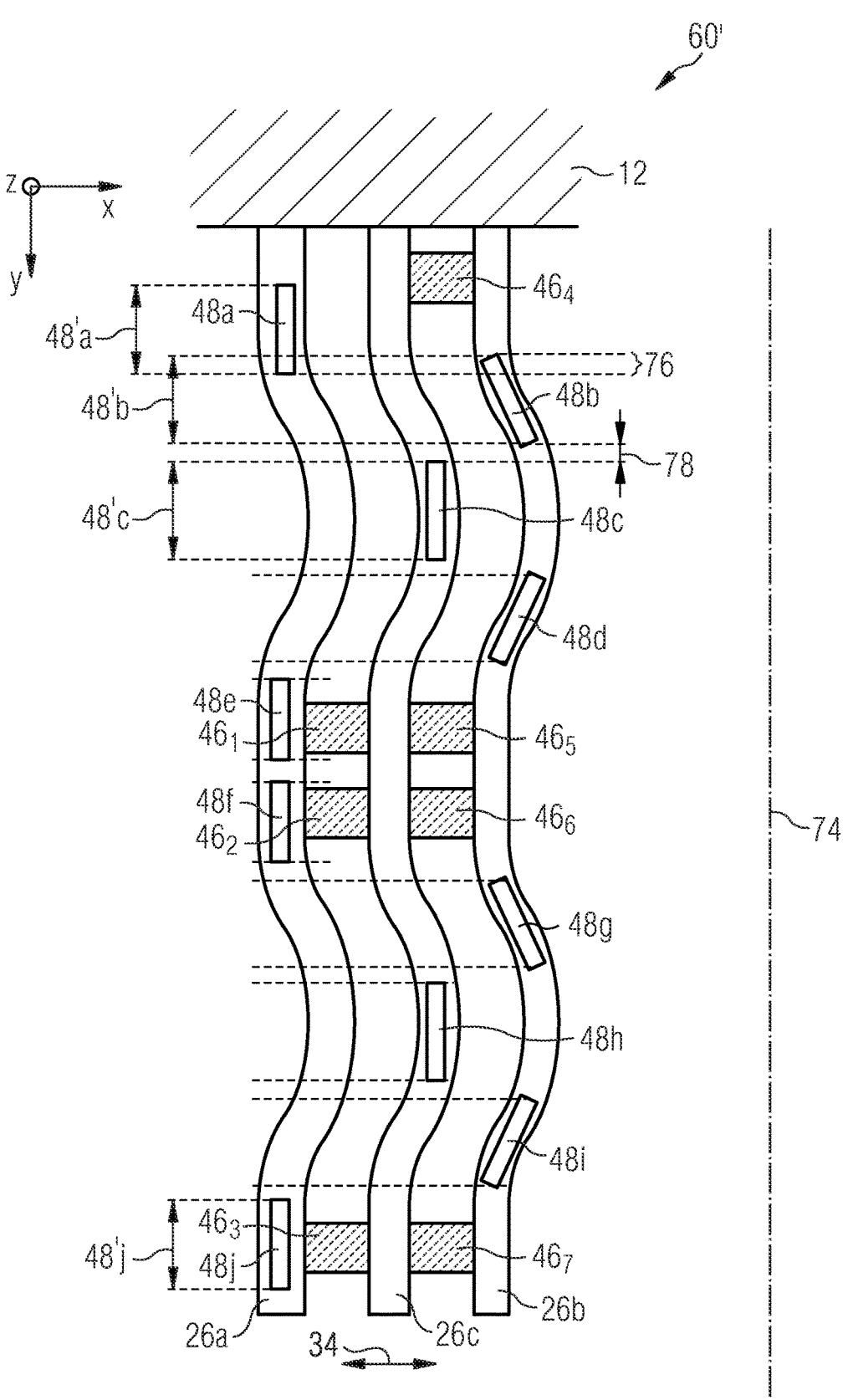
FIG. 6b is a schematic top view of an MEMS according to an embodiment, wherein partial elements of the resistor structure are arranged on at least two of the electrodes.

FIG. 6b shows a schematic top view of an MEMS 60' according to an embodiment, wherein the partial elements 48a to 48i are arranged on least two of the electrodes 26a, 26b and 26c, in the illustrated example, partial elements are arranged on each of the electrodes 26a, 26b and 26c. The partial elements are arranged in a distributed manner along the axial extension direction y in order to provide the fluidic resistance in the cavity. Arranging the same on different electrodes 26a, 26b and/or 26c results in a further degree of freedom in that projections 48'a to 48'i of the partial elements 48a to 48i overlap in a plane 74 arranged parallel to the axial extension direction and perpendicular to the substrate plane, for example in parallel to an y/z plane, i.e. have no distance, as illustrated, for example, for projections 48'a and 48'b. Although some of the projections 48'a to 48'i can have distances to adjacent projections, it can be advantageous that adjacent projections have an overlap.

Unlike in FIG. 6a, where fixings $46_1$ to $46_8$ are arranged symmetrically between electrodes 26 and 26c on the one hand and 26b and 26c on the other hand, the fixings $46_1$ to $46_7$ in FIG. 6b can be asymmetrical, for example to adjust an adaptation to the movement profile and/or load profile of the movable element.

The fluidic resistance is obtained along the direction of movement 34, although the partial element 48a is arranged on the electrode 26a and the partial element 48b on the electrode 26b. Reduction in stiffness is obtained by the division or segmentation. However, at the same time, the overlap 76 between the projections enables low fluidic losses. The fact that this is an optional feature becomes clear when considering the projections 48'b and 48'c which comprise, instead of the overlap 76, a distance 78 which is adjusted in correspondence with distances 72a to 72h to keep fluidic losses low.

In other words, it is additionally possible to divide the rear structure along its longitudinal axis to significantly reduce the contribution to the increase in stiffness in the direction of movement and hence the prevention of lateral deflection. Here, the divisions are illustrated by interruptions whose fluidic efficiency (prevention of a significant acoustic short-circuit, possibly attenuation adjustment) can be specifically adjusted by a respective geometrical choice (small gaps, i.e. distances 72). Essentially, it is advantageous to select the gaps small enough. Due to the limitation of the aspect ratio and, hence, given minimum interruption width as well as respective fluidic losses, it can be advantageous to alternately attach the rear structure to the electrodes as illustrated in FIG. 6b, such that fluidically a wall is built and the stiffness can still be significantly reduced and technological boundary conditions can be maintained due to the fact that the projections overlap.

In other words, FIGS. 6a and 6b show rear structures with interruptions. The structure of a micro loudspeaker or a micro-pump based on a rear structure is illustrated, i.e. the rear structure of FIGS. 4a to 4c can comprise a lid layer at the top and/or at the bottom and can be provided with inlets and/or outlets.

Figure 7A:
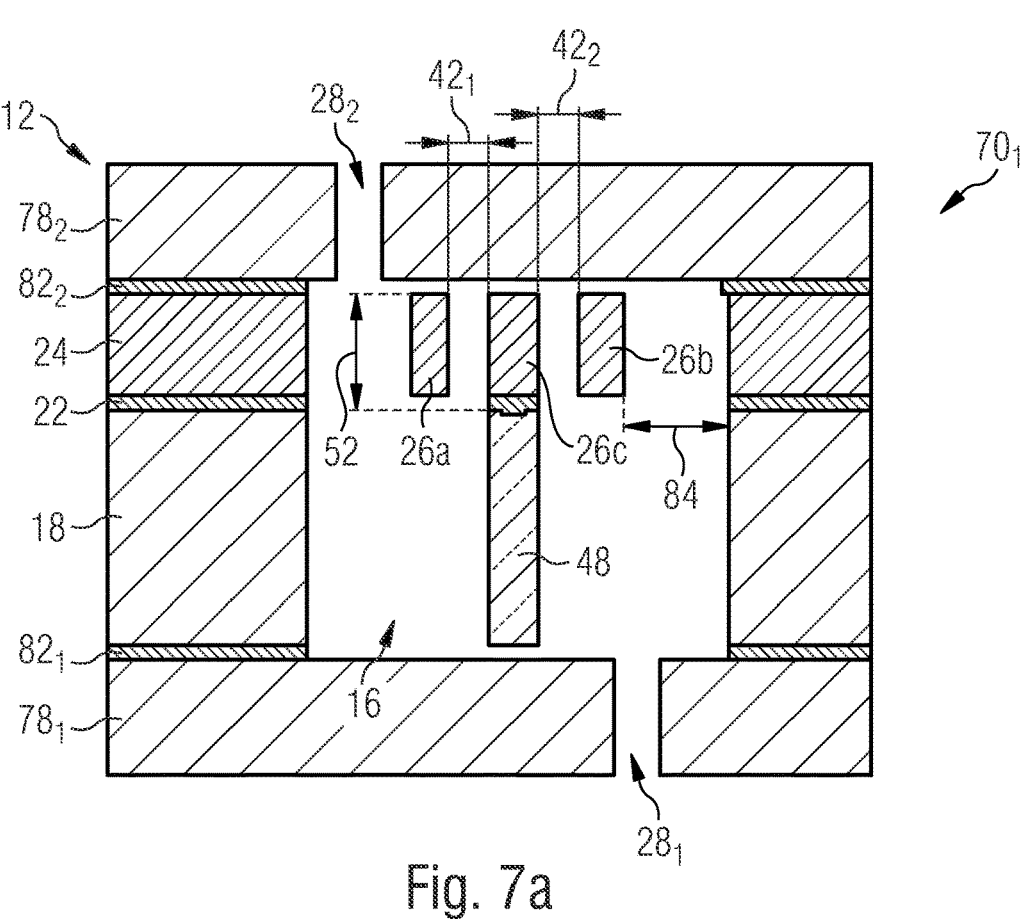
FIG. 7a is a schematic cross-sectional view of an MEMS according to an embodiment, for example the MEMS of FIG. 4a, through a lid layer.

FIG. 7a shows a schematic cross-sectional view of an MEMS $70_1$ according to an embodiment which supplements, for example, the MEMS 40 of FIG. 4a by the mentioned lid layers $78_1$ and $78_2$ which can be connected to layers 18 or 24 by means of further intermediate layers or bond layers $82_1$ and $82_2$. The layers $78_1$ and $78_2$ can be formed in the same manner as the layer 18. The bond layers $82_1$ and $82_2$ can be formed in the same or similar manner as the intermediate layer 22. A distance 84 between the external electrodes 26a and 26b of the movable element and the substrate 12 can be greater than the gaps $42_1$ to $42_2$ such that there is no essential limitation for the height 52.

In other words, in a micro loudspeaker and/or a micro-pump, the rear structure provides a further important design advantage. As described above, known micro loudspeakers, such as according to the MEMS 2000, suffer from the so-called vertical pull-in effect. This means that the drive voltage may not be so high that the L-NED beam is pulled towards the top or bottom and comes in contact with the lid layers, i.e. the vertical pull-in effect occurs. The stiffer the L-NED structure in the vertical direction along z, the higher the drive voltage can be without the vertical pull-in taking place. The vertical pull-in is particularly critical for L-NED beams clamped on one side. In a normal case, the L-NED beams clamped on one side can deflect to a greater extent, at least at the free end than the beams clamped on two sides in the center. However, this advantage is possibly partially lost when the drive voltage is selected to be smaller due to the vertical pull-in effects than in the comparable L-NED beams clamped on two sides.

Possibly, the vertical stiffness of the L-NED structure is mainly defined by the thickness/height, by the length and the clamping of the L-NED beams. The thicker and shorter the beam and/or the higher the stiffness of the clamping, the more insensitive is the beam to the vertical pull-in. However, as discussed, the thickness of the L-NED beam cannot be selected to have any size since the limitations of the production processes apply accordingly, such as the limitation of the Bosch process. The length of the beam can also not be selected to be too short and the stiffness of the clamping not too low since this limits the lateral deflection. This means long beams having clamping of low stiffness are desirable for the micro loudspeaker and the micro-pump with regard to the design in order to obtain high deflection. However, this limits the drive voltage due to the vertical pull-in. Therefore, the advantage that has been obtained with respect to the deflection by selecting long beams and low stiffness might partly be lost again by reducing the drive voltage due to vertical pull-in effects.

The discussed rear structure/resistor structure offers a solution for the above-described dilemma. Since the height of the rear structure can be selected in any size, for example eight times greater than the L-NED beams, the stiffness of the overall structure is significantly increased by the rear structure in vertical direction and dominates with regard to the overall stiffness. Thereby, additional clearance is obtained for designing the length and/or clamping of the L-NED beam. For example, for obtaining more lateral deflection, the beam can be designed to be longer and the clamping can be designed to be softer. The resulting disadvantage concerning the vertical pull-in effect is then compensated by the height of the rear structure. This advantage applies both to L-NED beams clamped on one side as well as to L-NED beams clamped on two sides.

Figure 7B:
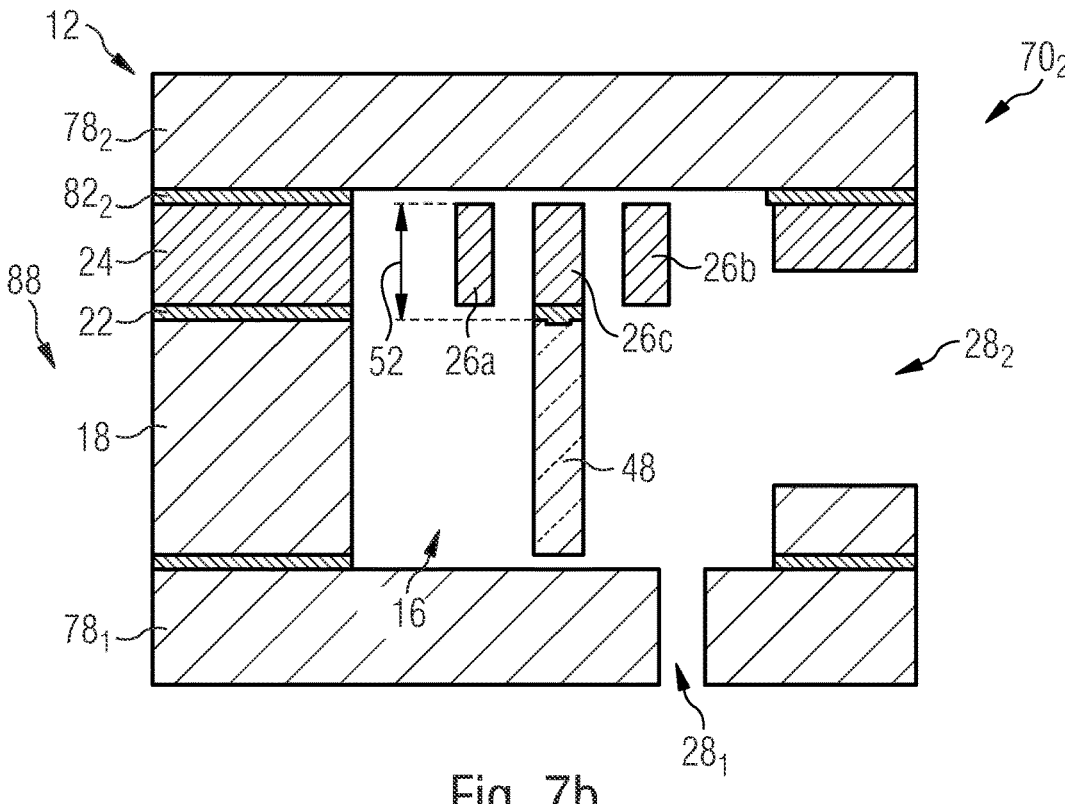
FIG. 7b is a schematic cross-sectional view of an MEMS according to an embodiment, wherein an opening for connecting the cavity to an external environment is arranged outside the substrate in a plane of the movable layer arrangement.

FIG. 7b shows a schematic cross-sectional view of an MEMS $70_2$ according to an embodiment, wherein the opening $28_2$ for connecting the cavity 16 to an external environment 88 outside the substrate 12 is arranged in a plane of the movable layer arrangement, this means the same overlaps at least partly with the resistor element 48 and/or the layer 24 of the electrodes 26a, 26b and 26c and/or the intermediate layer 22. Such a laterally arranged opening can enable the usage of the layer $78_2$ for other purposes than an opening. Alternatively or additionally, the opening $28_1$ can also be laterally arranged. A lateral arrangement of one or several openings is possible in all MEMS described herein without any limitation. The openings $28_1$ and $28_2$ can also be arranged in the area of the clampings of a beam clamped on two sides in the area of the movable layer arrangement or in the area of the clamped and freely movable end of a beam clamped on one side of the movable layer arrangement.

Figure 8A:
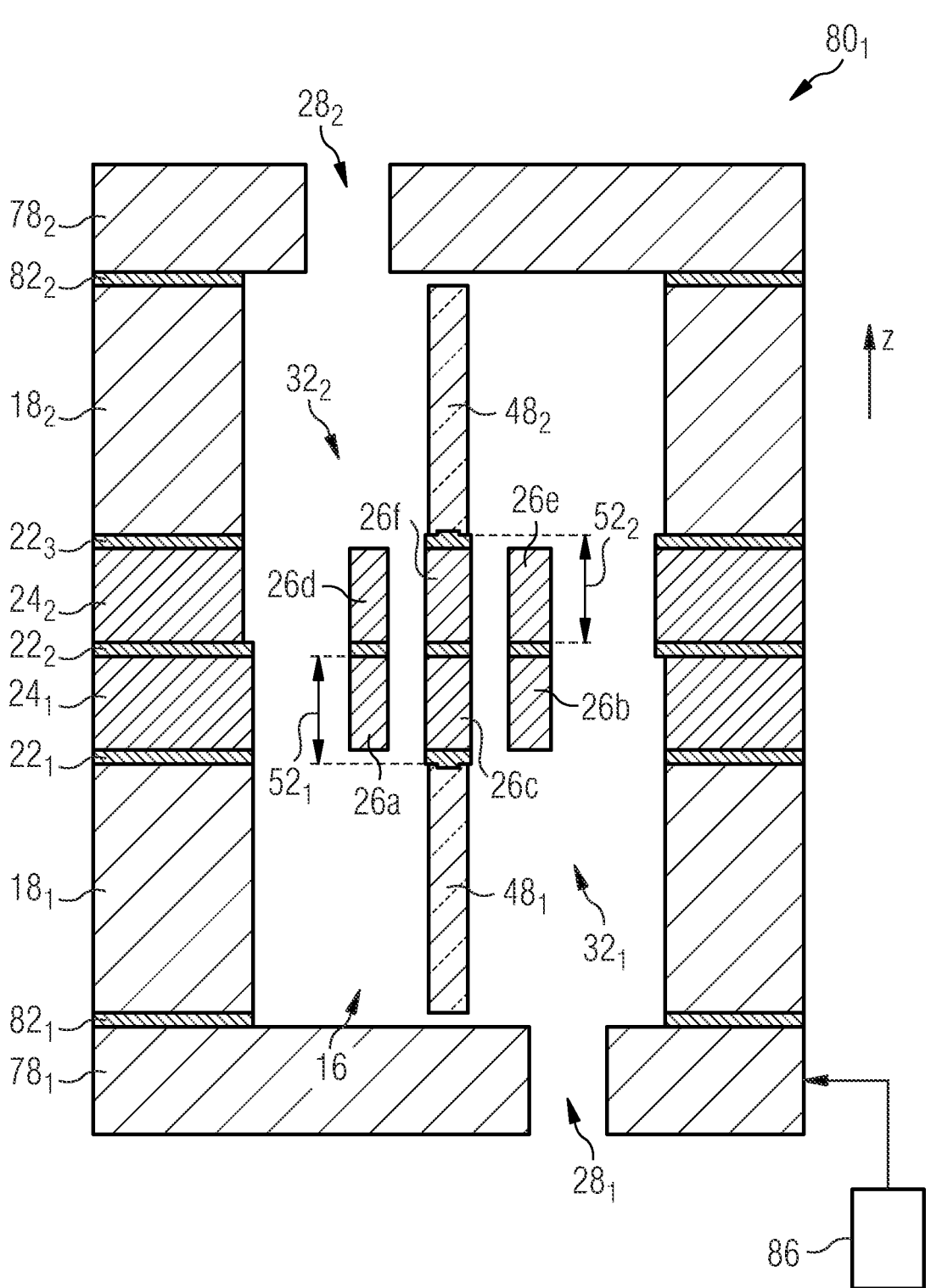
FIG. 8a is a schematic cross-sectional view of an MEMS according to an embodiment combining the features of the doubly configured electrodes and the rear structure or resistor structure.

FIG. 8a shows a schematic cross-sectional view of an MEMS 80₁ according to an embodiment combining the features of the double electrodes and the rear structure or resistor structure. This can also be considered such that, for example, the movable structure in the cavity 16 described in the context of the MEMS 70₁ is also doubled and/or that the MEMS 10, 20, 30₁ or 30₂ is additionally provided with the resistor structure or is provided with several resistor structures. In that way, for example, the layers 24₁ and 24₂ can be structured in the electrodes 26a, 26b and 26c or 26d, 26e and 26f that are connected to one another completely or partly via the intermediate layer 22₂. Thereby, two movable elements 32₁ and 32₂ can be obtained that can be mechanically firmly connected to one another via the connection to the intermediate layer 22₂. A respective resistor structure 48₁ or 48₂ can be mechanically firmly connected to the respective movable element 32₁ and 32₂ or can be part thereof. Here, the resistor structures 48₁ and 48₂ can be configured in the same or in a differing manner, for example by structuring into a different number of partial areas, an arrangement of the resistor structure or partial areas thereof at different electrodes and/or different dimensions along the z direction as it is possible for all layers of the movable elements 32₁ and 32₂.

The MEMS 80₁ can be configured such that the movable elements are arranged adjacent to one another with respect to the electrode arrangements 26a to 26c and 26d to 26f along the direction z perpendicular to the substrate plane between the first resistor structure 48₁ and 48₂.

Figure 8B:
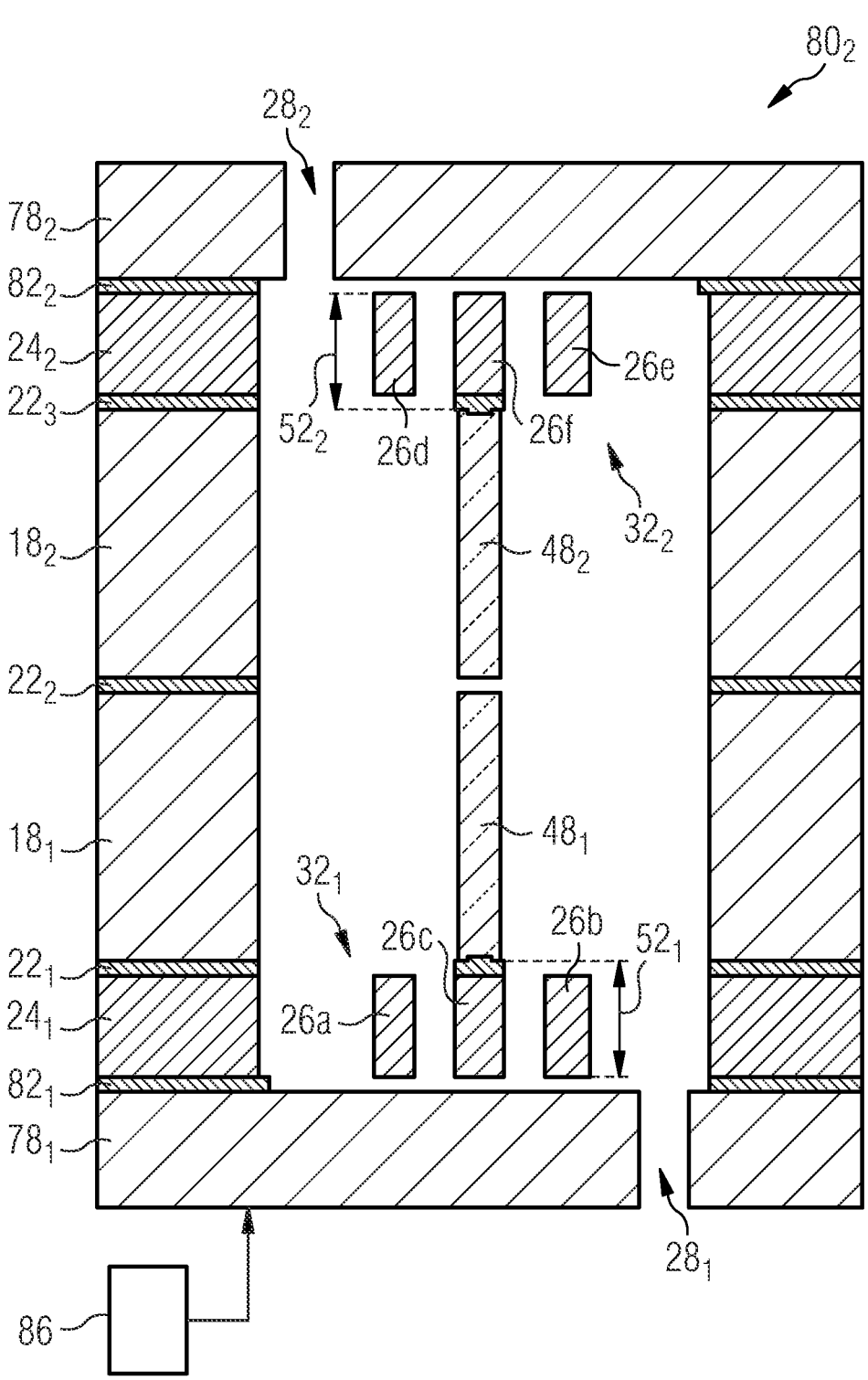
FIG. 8b is a schematic cross-sectional view of the MEMS according to an embodiment, wherein the relative orientation of two movable elements with respect to the MEMS of FIG. 8a is exchanged, such that the resistor structures are arranged adjacent to one another.

FIG. 8b shows a schematic cross-sectional view of the MEMS 80₂, wherein the relative orientation of the movable elements 32₁ and 32₂ is inter-exchanged with respect to the MEMS 80₁, such that the resistor structures 48₁ and 48₂ are arranged adjacent to one another and along the z direction perpendicular to the substrate plane between the movable elements 32₁ and 32₂ and the electrode arrangements 26a to 26c and 26d to 26f, respectively. Although the intermediate layer 22₂ between the resistor structures 48₁ and 48₂ is illustrated as being removed, the same can also be provided for mechanical fixing between the resistor structures 48₁ and 48₂. In the shown variation, however, the resistor structures 48₁ and 48₂ can be movable with respect to one another, which enables different control. Both resistor structures can be connected to an active structure that enables or controls this movement, such as via the movable elements 32₁ and 32₂. A control means provided for the MEMS 80₁ and 80₂ can be configured to individually or commonly control the movable elements 32₁ and 32₂. The control means 86 can be provided for any other MEMS described herein to control the movable layer structure.

In other words, the idea of stacking electrodes and the rear structure can be combined to obtain even higher sound pressure levels. Exemplary combinations are illustrated in FIGS. 8a and 8b. This can again effect doubling of the movable volume, i.e. in the case of a micro loudspeaker 6 dB extra volume can be obtained. This means the combination of stacking and rear structure could effect a theoretical improvement of the volume of approximately 25 dB (2×9), wherein it is assumed that in this example 20*log(2*9)=25 dB with 2 for doubling of the volume and 9 the factor of the obtained overall height (600+75)/75 is described. In this structure according to FIG. 8a, the vertical pull-in can even be completely eliminated. When the rear structures 48₁ and 48₂ as well as the lids 78₁ and 78₂ are connected to ground, an occurrence of electrical forces between the rear structure and the lid wafers can be prevented, i.e. the vertical pull-in can practically no longer occur.

Although FIGS. 8a and 8b show stacking of two L-NED-T actuators, wherein T indicates the shape of the electrodes combined with the resistor structure, this concept can be extended in any way such that, for example, further additional electrode structures or L-NED actuators can be added.

Figure 9:
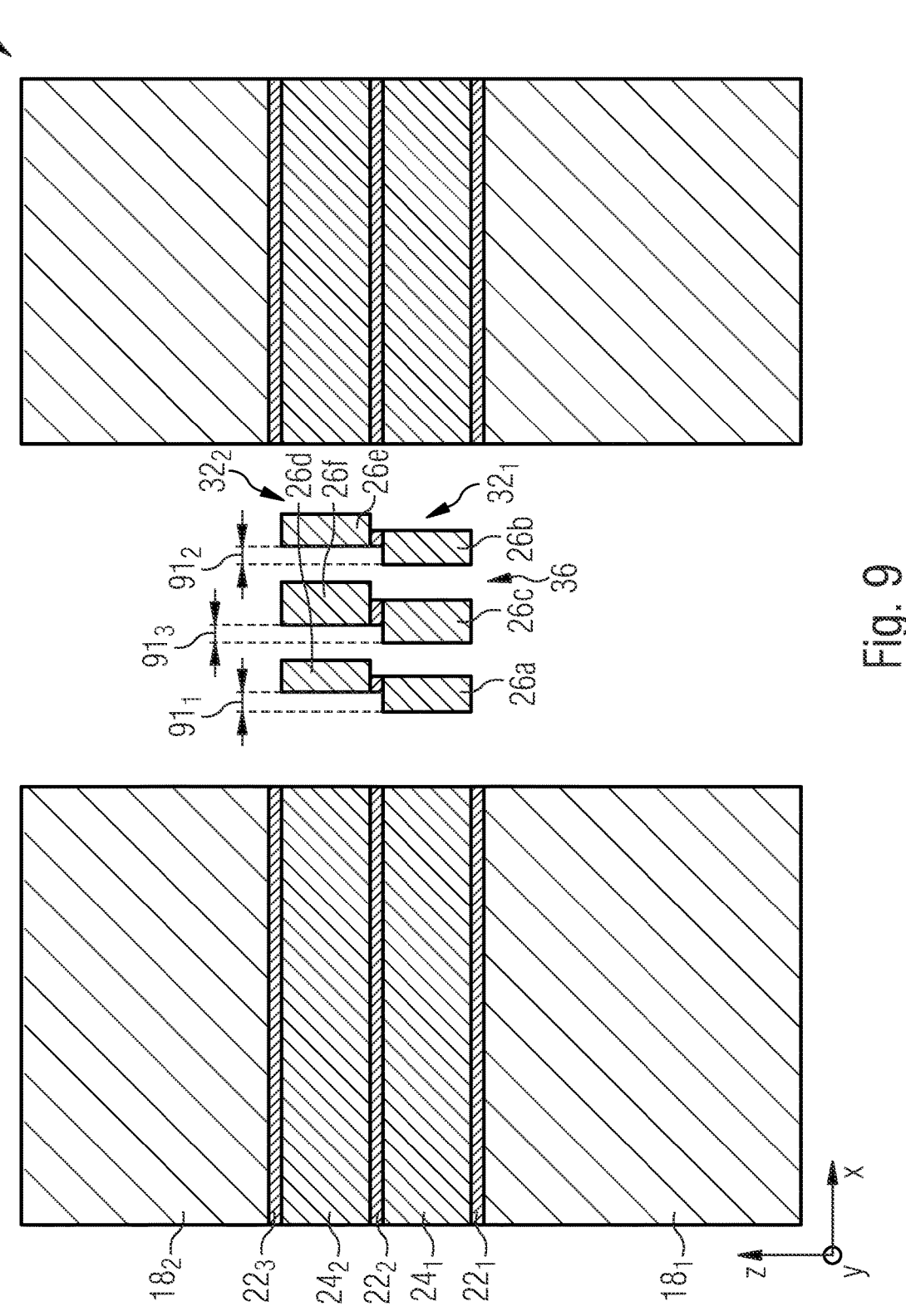
FIG. 9 is a schematic cross-sectional view of the MEMS according to an embodiment, wherein the electrodes of different layers are connected to one another and have an offset to one another.

FIG. 9 shows a schematic side-sectional view of an MEMS 100 according to an embodiment, wherein the electrodes or beams 26a, 26b and 26c are offset by a possibly electrode-individual offset 91₁, 91₂ and 91₃, respectively, with respect to the beams or electrodes 26d, 26e and 26f, respectively, which are arranged in the adjacent layer, wherein the offset can alternatively also have the same amount for two or several elements or can also be directed in different directions along the x direction.

The layers 24₁ and 24₂ as well as the movable elements 32₁ and 32₂ structured from these layers are connected to one another, e.g. via intermediate layers 22₁ and 22₂. Embodiments include that the distances 91₁, 91₂ and 91₃ do not have to assume the same values but can do so.

Figure 10:
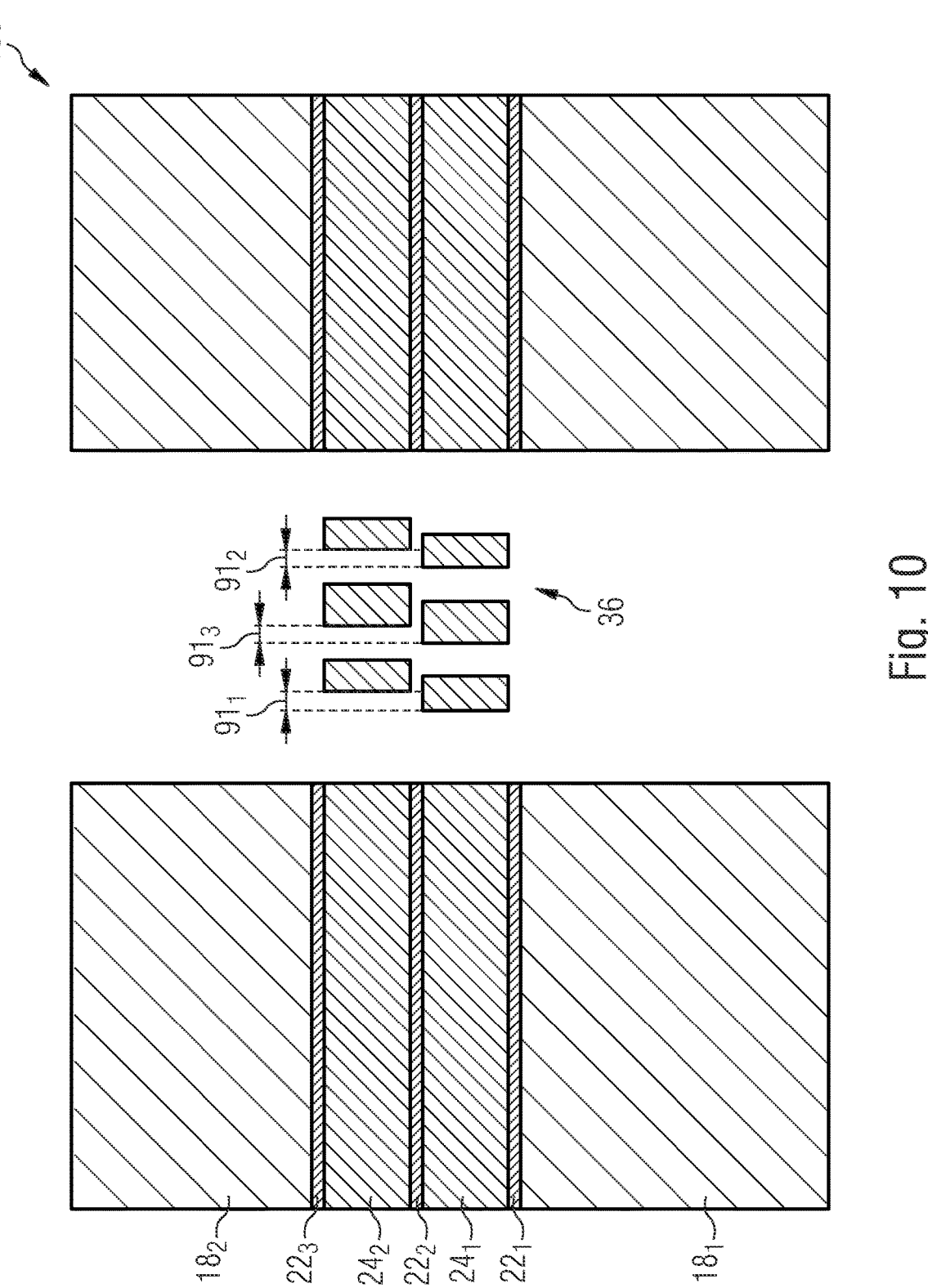
FIG. 10 is a schematic cross-sectional view of the MEMS according to an embodiment, wherein the electrodes of different layers are contactless to one another and have an offset to one another.

FIG. 10 shows in a cross-sectional illustration of an embodiment that the layers 24₁ and 24₂ that are structured in beams form the movable layer arrangement 36. Analogously to FIG. 9, the distances of the beams 91₁, 91₂ and 91₃ are at most 100 μm, advantageously 50 μm, most advantageously 5 μm.

Embodiments of the present invention also make it possible to design the entry openings and/or exit openings laterally in the plane of the rear structure, such that the lid and floor plane are available for electrical signal distribution. Thereby, increased packing density can be obtained.

Embodiments enable high enlargement of the transversal or cross-area of an L-NED based actuator, e.g., 16 times. For an inventive micro loudspeaker, this can generate a sound level of up to 24 dB more, which is a significant amount. Above that, the effect is also advantageous for inventive micro-pumps. The vertical pull-in voltage is heavily increased since the height of the overall structure is increased by the rear structure. A higher pull-in voltage provides several design freedoms, for example making the L-NED length longer and making the clamping (on one or two sides) softer to obtain a greater NED deflection. Apart from pumps, loudspeakers and microphones, other applications relate also to MEMS waveguides for high frequencies, in particular in the THz range.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus.

While this invention has been described in terms of several advantageous embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A microelectromechanical system (MEMS), comprising:

a substrate comprising a cavity;

US 12,565,416 B2

23                                                    24 a movable layer arrangement arranged in the cavity comprising a first beam, a second beam and a third beam that is arranged between the first beam and the second beam and that is fixed at discrete areas electrically insulated from the same;

wherein the movable layer arrangement is configured to perform a movement along a direction of movement in-plane with respect to a substrate plane in response to an electrical potential between the first beam and the third beam or in response to an electrical potential between the second beam and the third beam;

wherein the first beam, the second beam and the third beam are part of a first layer of the movable layer arrangement and the movable layer arrangement comprises a second layer that is arranged adjacent to the first layer along a direction perpendicular to the substrate plane, wherein the second layer is arranged movably along the direction of movement;

wherein, in relation to the first layer, the second layer provides additional area for interaction with a fluid.

2. The MEMS according to claim 1, wherein the first beam, the second beam and the third beam form a movable element and wherein the second layer forms a resistor structure for interaction with a fluid in the cavity, which is mechanically connected to the movable element and which is moved together and/or deformed together with the movable element.

3. The MEMS according to claim 2, wherein the resistor structure comprises several partial elements that are arranged perpendicular to the direction of movement and in parallel to the substrate plane along an axial extension direction of the movable layer arrangement.

4. The MEMS according to claim 3, wherein the partial elements are at a distance to one another along the axial extension direction.

5. The MEMS according to claim 4, wherein the distance is at most 100 µm, advantageously at most 100 µm, most advantageously at most 1 µm.

6. The MEMS according to claim 3, wherein the partial elements are mechanically firmly connected either to the first beam or to the second beam or to the third beam.

7. The MEMS according to claim 3, wherein the partial elements are arranged on at least two of the first beam, the second beam and the third beam.

8. The MEMS according to claim 2, wherein the resistor structure is adapted to provide a mechanical fluidical resistance when interacting with the fluid.

*     *     *     *     *